United States Patent
Kaneko et al.

(10) Patent No.: US 10,404,230 B2
(45) Date of Patent: Sep. 3, 2019

(54) PIEZOELECTRIC THIN FILM RESONATOR, FILTER, AND DUPLEXER

(71) Applicant: TAIYO YUDEN CO., LTD., Tokyo (JP)

(72) Inventors: Hiroomi Kaneko, Tokyo (JP); Hiroshi Kawakami, Tokyo (JP); Shinji Taniguchi, Tokyo (JP); Tokihiro Nishihara, Tokyo (JP); Tsuyoshi Yokoyama, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 193 days.

(21) Appl. No.: 15/416,283

(22) Filed: Jan. 26, 2017

(65) Prior Publication Data
US 2017/0257076 A1 Sep. 7, 2017

(30) Foreign Application Priority Data
Mar. 4, 2016 (JP) ................................ 2016-042822

(51) Int. Cl.
*H03H 9/02* (2006.01)
*H03H 9/70* (2006.01)
(Continued)

(52) U.S. Cl.
CPC ..... *H03H 9/02118* (2013.01); *H01L 41/0475* (2013.01); *H01L 41/0533* (2013.01);
(Continued)

(58) Field of Classification Search
CPC .......... H03H 9/02015; H03H 9/02118; H03H 9/706; H03H 9/172; H03H 9/173;
(Continued)

(56) References Cited

U.S. PATENT DOCUMENTS 8,084,919 B2 * 12/2011 Nishihara .......... H03H 9/02118
310/320
2007/0247260 A1 10/2007 Yanase et al.
(Continued)

FOREIGN PATENT DOCUMENTS

JP 2007-295280 A 11/2007
JP 2010-045437 A 2/2010
(Continued)

OTHER PUBLICATIONS

Japanese Office Action dated Oct. 9, 2018, in a counterpart Japanese patent application No. 2016-042822. (A machine translation (not reviewed for accuracy) attached.).
(Continued)

*Primary Examiner* — Robert J Pascal
*Assistant Examiner* — Jorge L Salazar, Jr.
(74) *Attorney, Agent, or Firm* — Chen Yoshimura LLP

(57) ABSTRACT

A piezoelectric thin film resonator includes: lower and upper electrodes located on a substrate and facing each other; a piezoelectric film sandwiched between the lower and upper electrodes and including lower and upper piezoelectric films, an outer outline of the upper piezoelectric film coinciding with or being located further out than an outer outline of a resonance region in a region surrounding the resonance region, the outer outline of the upper piezoelectric film being located further in than an outer outline of the lower piezoelectric film in the region; an insertion film interposed between the lower and upper piezoelectric films, located in an outer peripheral region within the resonance region, not located in a central region of the resonance region, and located on an upper surface of the lower piezoelectric film in the region; and a protective film located on the upper electrode in the resonance region, and located so as to cover
(Continued)

an end face of the upper piezoelectric film and an upper surface of the insertion film in the region.

14 Claims, 18 Drawing Sheets

(51) Int. Cl.
*H01L 41/047* (2006.01)
*H01L 41/053* (2006.01)
*H03H 9/17* (2006.01)
*H01L 41/187* (2006.01)

(52) U.S. Cl.
CPC ............ *H03H 9/172* (2013.01); *H03H 9/173* (2013.01); *H03H 9/174* (2013.01); *H03H 9/175* (2013.01); *H03H 9/706* (2013.01); *H01L 41/187* (2013.01)

(58) Field of Classification Search
CPC .... H03H 9/174; H03H 9/175; H01L 41/0475; H01L 41/187
USPC ......................................... 333/133, 187, 188
See application file for complete search history.

(56) References Cited

U.S. PATENT DOCUMENTS

| | | |
|---|---|---|
| 2010/0033063 A1 | 2/2010 | Nishihara et al. |
| 2012/0218057 A1 | 8/2012 | Burak et al. |
| 2013/0038405 A1 | 2/2013 | Taniguchi et al. |
| 2014/0139077 A1 | 5/2014 | Choy et al. |
| 2014/0210570 A1 | 7/2014 | Nishihara et al. |
| 2016/0035960 A1 | 2/2016 | Lee et al. |

FOREIGN PATENT DOCUMENTS

| | | |
|---|---|---|
| JP | 2013-038658 A | 2/2013 |
| JP | 2014-161001 A | 9/2014 |

OTHER PUBLICATIONS

Japanese Office Action dated Apr. 3, 2018, in a counterpart Japanese patent application No. 2016-042822. (A machine translation (not reviewed for accuracy) attached.).

* cited by examiner

PIEZOELECTRIC THIN FILM RESONATOR, FILTER, AND DUPLEXER

CROSS-REFERENCE TO RELATED APPLICATION

This application is based upon and claims the benefit of priority of the prior Japanese Patent Application No. 2016-042822, filed on Mar. 4, 2016, the entire contents of which are incorporated herein by reference.

FIELD

A certain aspect of the present invention relates to a piezoelectric thin film resonator, a filter, and a duplexer.

BACKGROUND

Acoustic wave devices using piezoelectric thin film resonators are used as filters and duplexers of wireless devices such as, for example, mobile phones. The piezoelectric thin film resonator has a structure designed to have a lower electrode and an upper electrode facing each other across a piezoelectric film. A region where the lower electrode and the upper electrode face each other across the piezoelectric film is a resonance region. There has been known a technique that improves the Q-value by inserting an insertion film in the piezoelectric film as disclosed in Japanese Patent Application Publication No. 2014-161001 (Patent Document 1).

The piezoelectric thin film resonator in accordance with Patent Document 1 can reduce the leak of the acoustic wave energy from the resonance region and improve the Q-value. However, it is difficult to sufficiently reduce the leak of the acoustic wave energy from the resonance region, and the degree of improvement of the Q-value is insufficient. In addition, the adhesiveness of the boundary face between the insertion film and the piezoelectric film is low, and thus, the insertion film may be peeled.

SUMMARY OF THE INVENTION

According to a first aspect of the present invention, there is provided a piezoelectric thin film resonator including: a substrate; a lower electrode and an upper electrode that are located on the substrate, and face each other in a stacking direction; a piezoelectric film that is sandwiched between the lower electrode and the upper electrode, and includes a lower piezoelectric film and an upper piezoelectric film, an outer outline of the upper piezoelectric film coinciding with or being located further out than an outer outline of a resonance region, in which the lower electrode and the upper electrode face each other across the piezoelectric film, in at least a part of a region surrounding the resonance region, the outer outline of the upper piezoelectric film being located further in than an outer outline of the lower piezoelectric film in the at least a part of the region surrounding the resonance region; an insertion film that is interposed between the lower piezoelectric film and the upper piezoelectric film, is located in at least a part of an outer peripheral region within the resonance region, is not located in a central region of the resonance region, and is located on at least a part of an upper surface of the lower piezoelectric film in the at least a part of the region surrounding the resonance region; and a protective film that is located on the upper electrode in the resonance region, and is located so as to cover an end face of the upper piezoelectric film and at least a part of an upper surface of the insertion film in the at least a part of the region surrounding the resonance region.

According to a second aspect of the present invention, there is provided a piezoelectric thin film resonator including: a substrate; a lower electrode and an upper electrode that are located on the substrate, and face each other in a stacking direction; a piezoelectric film that is sandwiched between the lower electrode and the upper electrode, and of which an outer outline of an upper surface is located further out than an outer outline of a resonance region, in which the lower electrode and the upper electrode face each other across the piezoelectric film, in at least a part of a region surrounding the resonance region; an insertion film that is interposed between the piezoelectric film and the upper electrode, is located in at least a part of an outer peripheral region within the resonance region, and is not located in a central region of the resonance region; and a protective film that is located on the upper electrode in the resonance region, and of which an outer outline is located further out than an outer outline of the resonance region in the at least a part of the region surrounding the resonance region.

According to a third aspect of the present invention, there is provided a filter including: any one of the above piezoelectric thin film resonators.

According to a fourth aspect of the present invention, there is provided a duplexer including: the above filter.

DETAILED DESCRIPTION

Hereinafter, embodiments of the present invention will be described with reference to the accompanying drawings.

First Embodiment

Figure 1A:
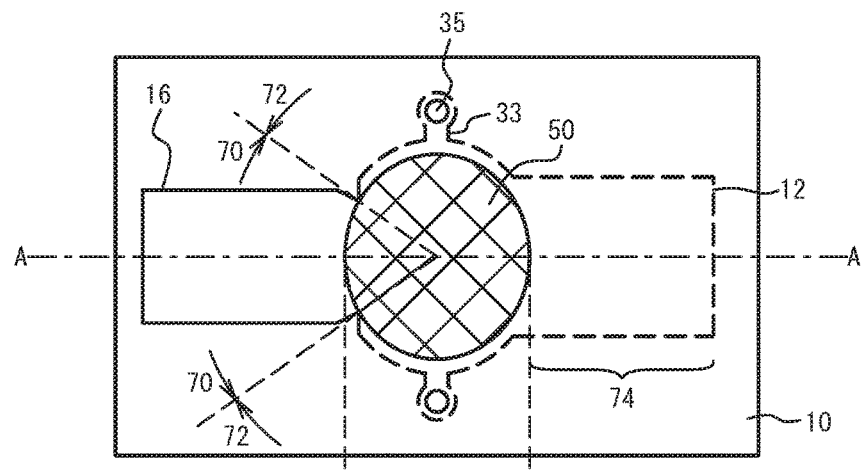
FIG. 1A is a plan view of a piezoelectric thin film resonator in accordance with a first embodiment.
Figure 1B:
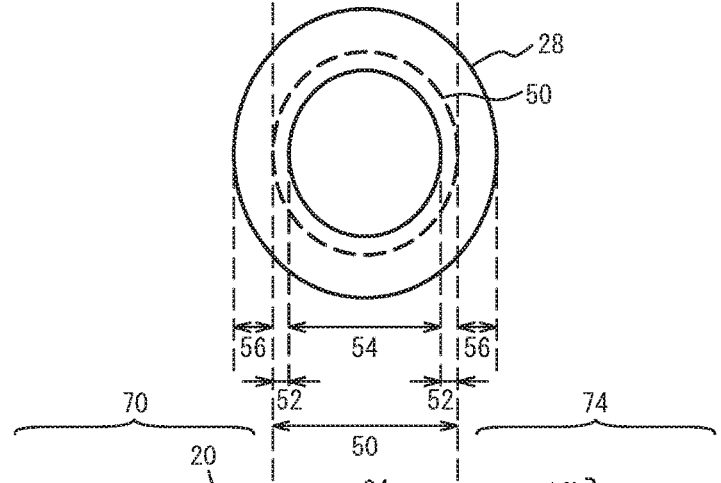
FIG. 1B is a plan view of an insertion film.
Figure 1C:
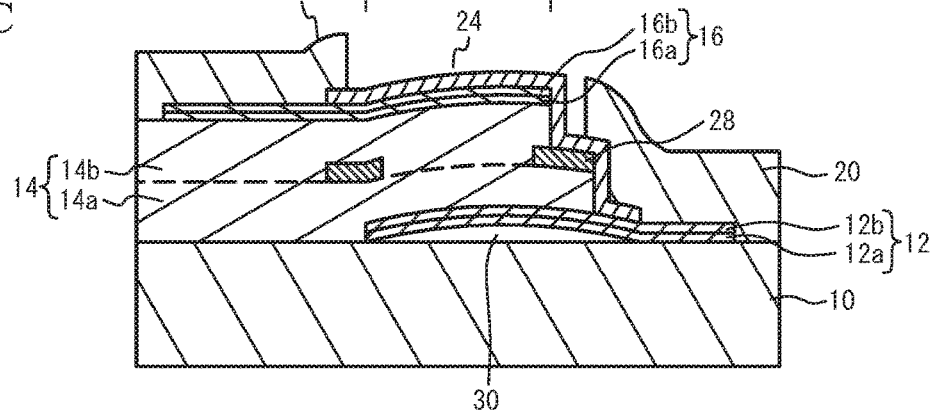
FIG. 1C is a cross-sectional view taken along line A-A in FIG. 1A.

FIG. 1A is a plan view of a piezoelectric thin film resonator in accordance with a first embodiment, FIG. 1B is a plan view of an insertion film, and FIG. 1C is a cross-sectional view taken along line A-A in FIG. 1A. As illustrated in FIG. 1A and FIG. 1C, a lower electrode 12 is located on a substrate 10. An air gap 30 having a dome-shaped bulge is formed between the flat principal surface of the substrate 10 and the lower electrode 12. The dome-shaped bulge is a bulge having a shape in which the height of the air gap 30 is high in the periphery of the air gap 30 and increases at closer distances to the center of the air gap 30, for example. The lower electrode 12 includes a lower layer 12a and an upper layer 12b.

Located on the lower electrode 12 is a piezoelectric film 14 mainly composed of aluminum nitride (AlN) having the main axis in the (002) direction. The piezoelectric film 14 includes a lower piezoelectric film 14a and an upper piezoelectric film 14b. An insertion film 28 is located between the lower piezoelectric film 14a and the upper piezoelectric film 14b. An upper electrode 16 is located on the piezoelectric film 14 so as to have a region (a resonance region 50) in which the upper electrode 16 faces the lower electrode 12 across the piezoelectric film 14 in a stacking direction. The resonance region 50 has an elliptical shape, and is a region in which the acoustic wave in the thickness extension mode resonates. The upper electrode 16 includes a lower layer 16a and an upper layer 16b.

The upper electrode 16 is extracted from the resonance region 50 to an extraction region 70. The lower electrode 12 is extracted from the resonance region 50 to an extraction region 74. In a region 72 other than the extraction region 70 in the region surrounding the resonance region 50, the end face of the upper piezoelectric film 14b substantially coincides with the edge of the resonance region 50. In the region 72, the end face of the lower piezoelectric film 14a is located further out than the edge of the resonance region 50. The insertion film 28 is located on the upper surface of the lower piezoelectric film 14a. In the extraction region 74, a wiring line 20 is formed on the lower electrode 12. In the extraction region 70, the wiring line 20 is formed on the upper electrode 16. A protective film 24 is formed on the upper electrode 16 and the insertion film 28. In the region 72, the protective film 24 covers the end face of the upper piezoelectric film 14b and the upper surface of the insertion film 28. The wiring line 20 covers the edge of the insertion film 28.

As illustrated in FIG. 1B, the insertion film 28 is located in an outer peripheral region 52 within the resonance region 50, and is not located in a central region 54. The outer peripheral region 52 is within the resonance region 50, includes the outer periphery of the resonance region 50, and is located along the outer periphery. The central region 54 is within the resonance region 50, and includes the center of the resonance region 50. The center may not be necessarily a geometric center. The insertion film 28 is located in a peripheral region 56 outside the resonance region 50. The insertion film 28 is continuously located from the outer peripheral region 52 to the peripheral region 56. As described above, the insertion film 28 is located in at least a part of the outer peripheral region 52 within the resonance region 50 and outside the outer peripheral region 52.

As illustrated in FIG. 1A, an introduction path 33 for etching a sacrifice layer is formed in the lower electrode 12. The sacrifice layer is a layer for forming the air gap 30. The vicinity of the tip of the introduction path 33 is not covered with the piezoelectric film 14, and the lower electrode 12 includes a hole portion 35 at the end of the introduction path 33.

A piezoelectric thin film resonator with a resonant frequency of 2 GHz will be described as an example. The substrate 10 is a silicon (Si) substrate. The lower electrode 12 is formed of a chrome (Cr) film with a film thickness of 100 nm and a ruthenium (Ru) film with a film thickness of 250 nm stacked in this order from the substrate 10 side. The piezoelectric film 14 is formed of an aluminum nitride (AlN) film with a film thickness of 1100 nm. Each of the lower and upper piezoelectric films 14a and 14b has a film thickness of 550 nm. The insertion film 28 is formed of a silicon oxide ($SiO_2$) film with a film thickness of 150 nm. The upper electrode 16 is formed of a Ru film with a film thickness of 250 nm and a Cr film with a film thickness of 50 nm stacked in this order from the piezoelectric film 14 side. The protective film 24 is formed of a silicon oxide film with a film thickness of 100 nm. The material and the film thickness of each layer may be appropriately designed to achieve desired resonance characteristics.

The substrate 10 may be, instead of a silicon substrate, a quartz substrate, a glass substrate, a ceramic substrate, or a GaAs substrate. The lower electrode 12 and the upper electrode 16 may be formed of a single-layer film of aluminum (Al), titanium (Ti), copper (Cu), molybdenum (Mo), tungsten (W), tantalum (Ta), platinum (Pt), rhodium (Rh) or iridium (Ir) or a multilayered film of at least two of them instead of Ru and Cr. The protective film 24 may be formed of, instead of a silicon oxide film, a silicon nitride film or aluminum nitride. The wiring line 20 is made of a metal layer such as copper or gold having a low electric resistance. An adhesion layer such as a titanium layer may be formed under a metal layer with a low electric resistance.

The piezoelectric film 14 may be made of, instead of aluminum nitride, zinc oxide (ZnO), lead zirconate titanate (PZT), or lead titanate ($PbTiO_3$). Alternatively, for example, the piezoelectric film 14 may be mainly composed of aluminum nitride, and contain other elements for improving the resonance characteristic or the piezoelectricity. For example, the use of scandium (Sc), a divalent element and a quadrivalent element, or a divalent element and a pentavalent element as additive elements improves the piezoelectricity of the piezoelectric film 14. Thus, the effective electromechanical coupling coefficient of the piezoelectric thin film resonator can be improved. The divalent element is, for example, calcium (Ca), magnesium (Mg), strontium (Sr), or zinc (Zn). The quadrivalent element is, for example, Ti, zirconium (Zr) or hafnium (Hf). The pentavalent element is, for example, Ta, niobium (Nb), or vanadium (V). Furthermore, the piezoelectric film 14 may be mainly composed of aluminum nitride and contain boron (B).

As described in Patent Document 1, the Young's modulus of the insertion film 28 is preferably less than that of the piezoelectric film 14. When the insertion film 28 and the piezoelectric film 14 have approximately the same density, since the Young's modulus correlates with the acoustic impedance, the acoustic impedance of the insertion film 28 is preferably less than that of the piezoelectric film 14. This configuration can improve the Q-value. Furthermore, to make the acoustic impedance of the insertion film 28 less than that of the piezoelectric film 14, when the piezoelectric film 14 is mainly composed of aluminum nitride, the insertion film 28 is preferably formed of an Al film, a gold (Au) film, a copper (Cu) film, a Ti film, a platinum (Pt) film, a tantalum (Ta) film, a Cr film, or a silicon oxide film. Especially, considering the Young's modulus, the insertion film 28 is preferably formed of an Al film or a silicon oxide film.

Figure 2A:
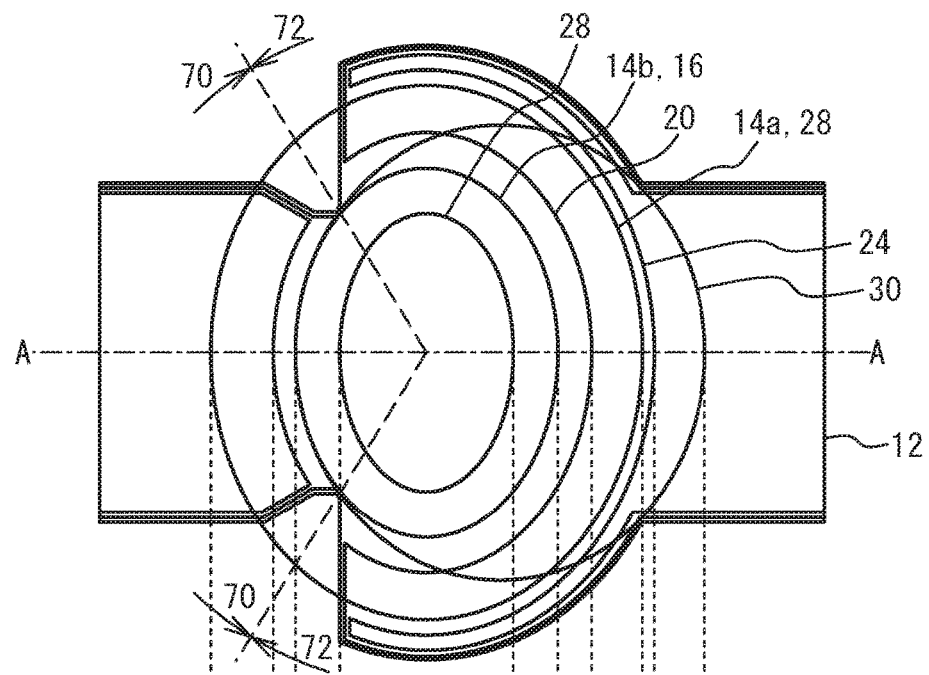
FIG. 2A is a plan view illustrating a positional relationship among layers of the piezoelectric thin film resonator in accordance with the first embodiment.
Figure 2B:
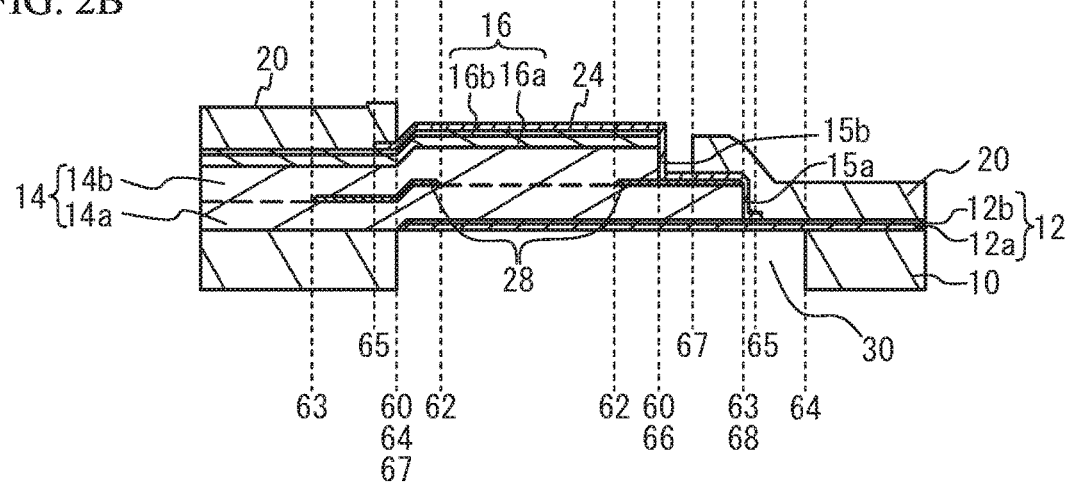
FIG. 2B is a cross-sectional view taken along line A-A in FIG. 2A.

FIG. 2A is a plan view illustrating a positional relationship among the layers of the piezoelectric thin film resonator of the first embodiment, and FIG. 2B is a cross-sectional view taken along line A-A in FIG. 2A. Although the air gap 30 is dome-shaped, FIG. 2B simplifies and illustrates the upper surface of the air gap 30 as a flat plane. In FIG. 2A and FIG. 2B, for easy understanding, the ratio of the length and the like are not necessarily the same as those of FIG. 1A through FIG. 1C. The same applies to the drawings hereinafter.

FIG. 1A through FIG. 2B illustrate an outer outline 60 that is the outer outline of the resonance region 50, an inner outline 62 that is the inner outline of the insertion film 28, an outer outline 63 of the insertion film 28, an outer outline 64 of the air gap 30, an outer outline 66 of the upper piezoelectric film 14b, an outer outline 68 of the lower piezoelectric film 14a, an outer outline 65 of the protective film 24, and an inner outline 67 of the wiring line 20. In the region surrounding the resonance region 50, the extraction region 70 in which the upper electrode 16 is extracted from the resonance region 50 and the region 72 other than the extraction region 70 of the region surrounding the resonance region 50 are illustrated.

In each film, when the end face is inclined or curved in the film thickness direction, the outer outline is the outermost of the inclined or curved end face, and the inner outline is the innermost of the inclined or curved end face. It will be described that the end face substantially coincides with the outline as long as at least a part of the inclined or curved end face substantially coincides with the outline. It will be described that the end face is located further out than (or further in than) the outline as long as at least a part of the inclined or curved end face is located further out than (or further in than) the outline. In addition, when the end face substantially coincides with the outline to the extent of, for example, variability in a fabrication process or alignment precision in the fabrication process, it will be described that the end face substantially coincides with the outline.

In the extraction region 70, the outer outline of the lower electrode 12 forms the outer outline 60 of the resonance region 50. In the region 72, the outer outline of the upper electrode 16 forms the outer outline 60 of the resonance region 50. In the extraction region 70, the outer outline 60 of the resonance region 50 substantially coincides with the outer outline 64 of the air gap 30. In the region 72, the outer outline 64 of the air gap 30 is located further out than the outer outline 60 of the resonance region 50. The inner outline 62 of the insertion film 28 is located further in than the outer outline 60 of the resonance region 50. In plan view, the upper piezoelectric film 14b overlaps the upper electrode 16, and has the same shape. That is, in the region 72, the outer outline 66 of the upper piezoelectric film 14b substantially coincides with the outer outline 60 of the resonance region 50. In the region 72, the outer outline 68 of the lower piezoelectric film 14a substantially coincides with the outer outline 63 of the insertion film 28. In the region 72, the outer outline 68 of the lower piezoelectric film 14a is located further in than the outer outline 64 of the air gap 30. End faces 15a and 15b of the lower and upper piezoelectric films 14a and 14b are substantially perpendicular to the surface direction of the substrate 10. In the extraction region 70, the outer outline 65 of the protective film 24 is located further out than the outer outline 60 of the resonance region 50. The inner outline 67 of the wiring line 20 coincides with or is located further out than the outer outline 60 of the resonance region 50 (in FIG. 2B, coincides with the outer outline 60 of the resonance region 50).

Figure 3A:
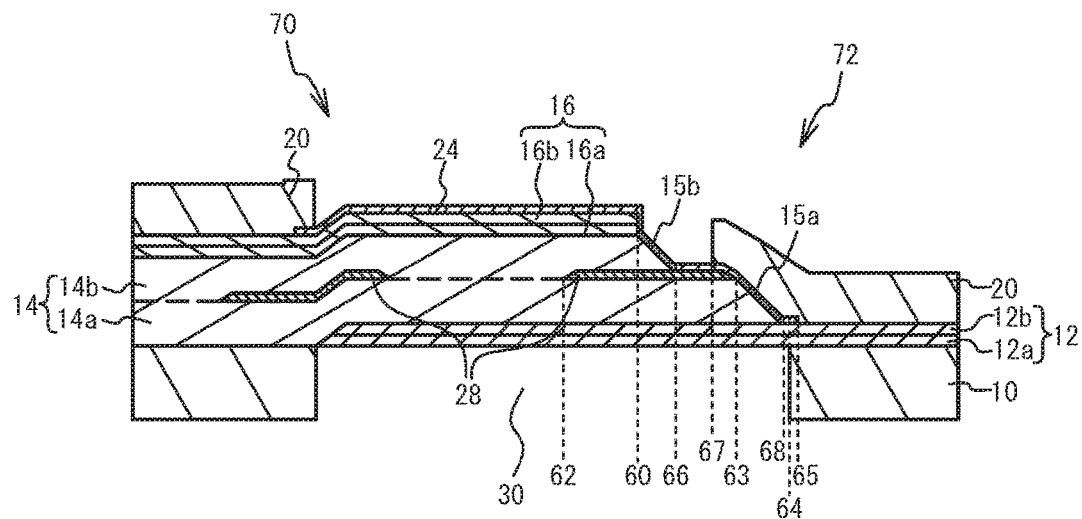
FIG. 3A and FIG. 3B are cross-sectional views of piezoelectric thin film resonators in accordance with first and second variations of the first embodiment.
Figure 3B:
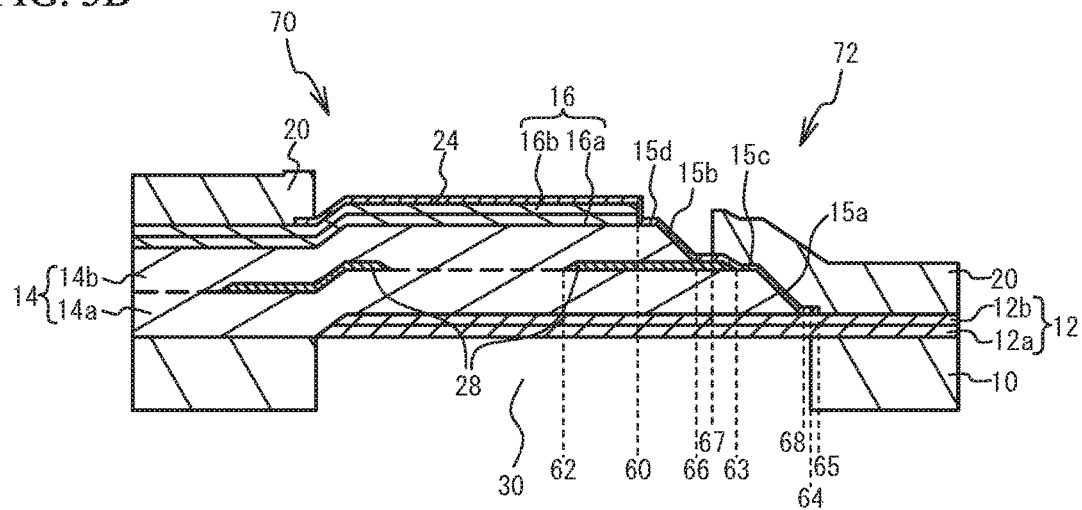

FIG. 3A and FIG. 3B are cross-sectional views of piezoelectric thin film resonators in accordance with first and second variations of the first embodiment, respectively. As illustrated in FIG. 3A, the end faces 15a and 15b of the lower and upper piezoelectric films 14a and 14b are inclined to the surface direction of the substrate 10. Other structures are the same as those of the first embodiment, and the description thereof is thus omitted. As illustrated in FIG. 3B, an upper surface 15c of the lower piezoelectric film 14a is exposed from the insertion film 28. An upper surface 15d of the upper piezoelectric film 14b is exposed from the upper electrode 16. Other structures are the same as those of the first variation of the first embodiment, and the description thereof is thus omitted.

Figure 4A:
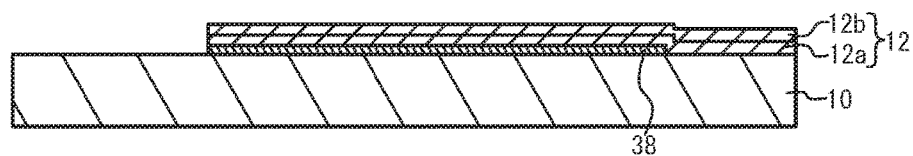
FIG. 4A through FIG. 4D are cross-sectional views (No. 1) illustrating a method of fabricating the first variation of the first embodiment.

Hereinafter, a fabrication method of the first embodiment and the variations thereof will be described with use of the first variation of the first embodiment as an example. FIG. 4A through FIG. 5D are cross-sectional views illustrating a fabrication method of the first variation of the first embodiment. As illustrated in FIG. 4A, a sacrifice layer 38 for forming an air gap is formed on the substrate 10 having a flat principal surface. The sacrifice layer 38 has a film thickness of, for example, 10 to 100 nm, and is made of a material selected from materials such as magnesium oxide (MgO), ZnO, germanium (Ge) or silicon oxide ($SiO_2$) that easily dissolves in an etching liquid or an etching gas. Then, the sacrifice layer 38 is patterned into a desired shape by photolithography and etching. The shape of the sacrifice layer 38 corresponds to the planar shape of the air gap 30, and includes, for example, a region to be the resonance region 50. Then, the lower layer 12a and the upper layer 12b as the lower electrode 12 are formed on the sacrifice layer 38 and the substrate 10. The sacrifice layer 38 and the lower electrode 12 are formed by, for example, sputtering, vacuum evaporation, or Chemical Vapor Deposition (CVD). Then, the lower electrode 12 is patterned into a desired shape by photolithography and etching. The lower electrode 12 may be formed by liftoff.

Figure 4B:
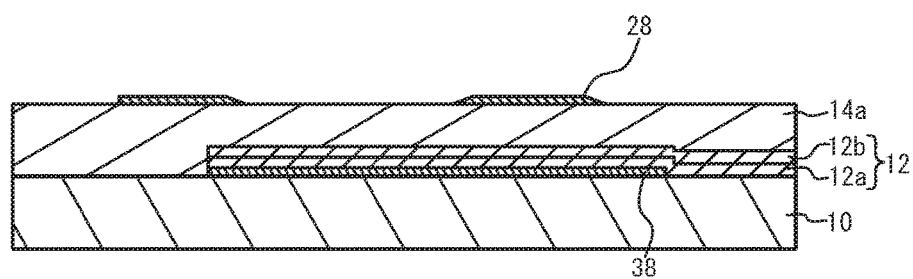

As illustrated in FIG. 4B, the lower piezoelectric film 14a is formed on the lower electrode 12 and the substrate 10 by, for example, sputtering, vacuum evaporation, or CVD. The insertion film 28 is formed on the lower piezoelectric film 14a by, for example, sputtering, vacuum evaporation, or CVD. The insertion film 28 is then patterned into a desired shape by photolithography and etching. The insertion film 28 may be formed by liftoff.

Figure 4C:
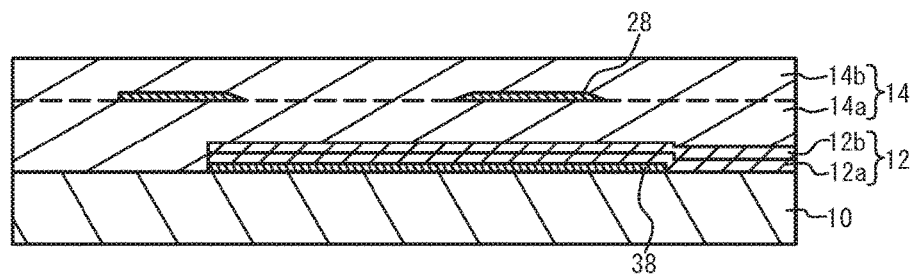
Figure 4D:
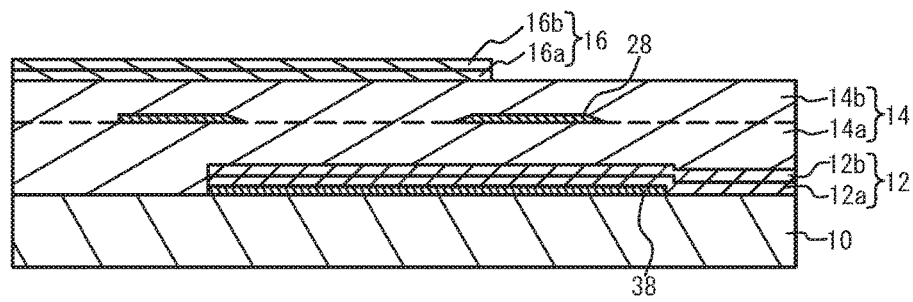

As illustrated in FIG. 4C, the upper piezoelectric film 14b is formed by, for example, sputtering, vacuum evaporation, or CVD. The lower and upper piezoelectric films 14a and 14b form the piezoelectric film 14. As illustrated in FIG. 4D, the lower layer 16a and the upper layer 16b of the upper electrode 16 are formed by sputtering, vacuum evaporation, or CVD. The upper electrode 16 is patterned into a desired shape by photolithography and etching. The upper electrode 16 may be formed by liftoff.

Figure 5A:
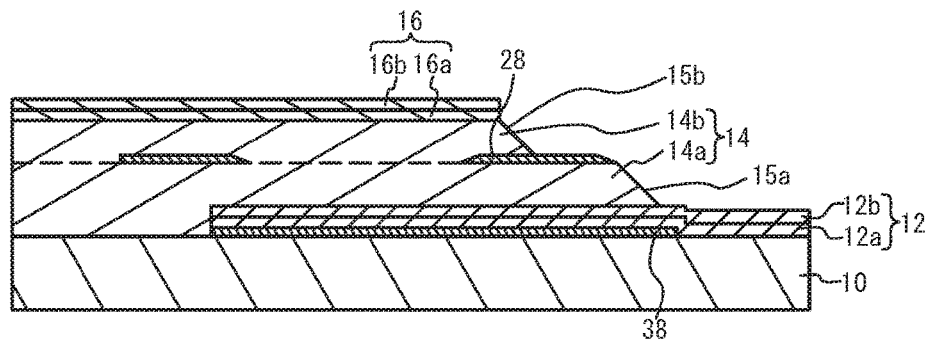
FIG. 5A through FIG. 5D are cross-sectional views (No. 2) illustrating the method of fabricating the first variation of the first embodiment.

As illustrated in FIG. 5A, the piezoelectric film 14 is patterned into a desired shape. At this time, the upper piezoelectric film 14b is etched using the upper electrode 16 as a mask, while the lower piezoelectric film 14a is etched using the upper electrode 16 and the insertion film 28 as a mask. This process causes the upper piezoelectric film 14b to be patterned into the same shape as the upper electrode 16, and causes the lower piezoelectric film 14a to be patterned into the same shape as the insertion film 28. The piezoelectric film 14 may be etched by wet etching or dry etching. When the piezoelectric film 14 is formed of an aluminum nitride film, a photoresist may be used as a mask for the etching of the piezoelectric film 14.

When wet etching is performed by using the insertion film 28 and the upper electrode 16 as a mask and using, for example, phosphoric acid as an etching liquid, a relatively long etching time makes the end faces 15a and 15b of the lower and upper piezoelectric films 14a and 14b substantially perpendicular to the upper surface of the substrate 10 as illustrated in FIG. 2B of the first embodiment. When the etching time is short, the end faces 15a and 15b of the lower and upper piezoelectric films 14a and 14b are inclined to the upper surface of the substrate 10 as in the first variation of the first embodiment. When the etching time is further short, the upper surfaces 15c and 15d of the lower and upper piezoelectric films 14a and 14b remain outside the insertion film 28 and the upper electrode 16 as in the second variation of the first embodiment.

Figure 5B:
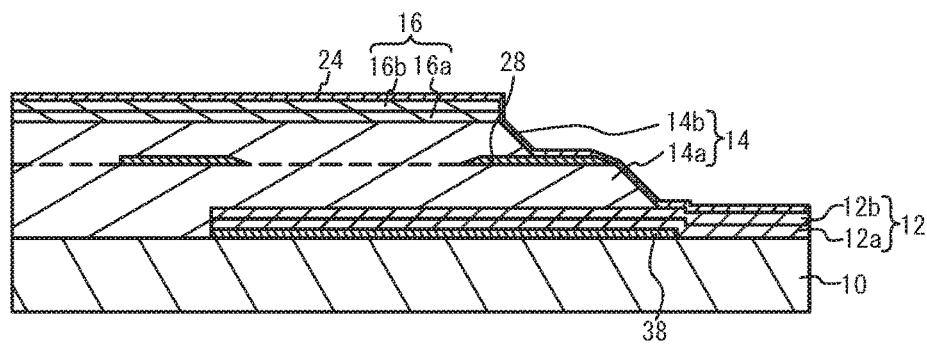
Figure 5C:
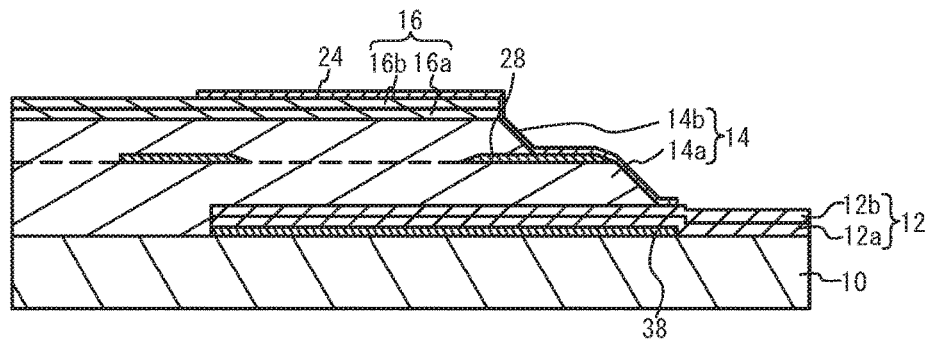
Figure 5D:
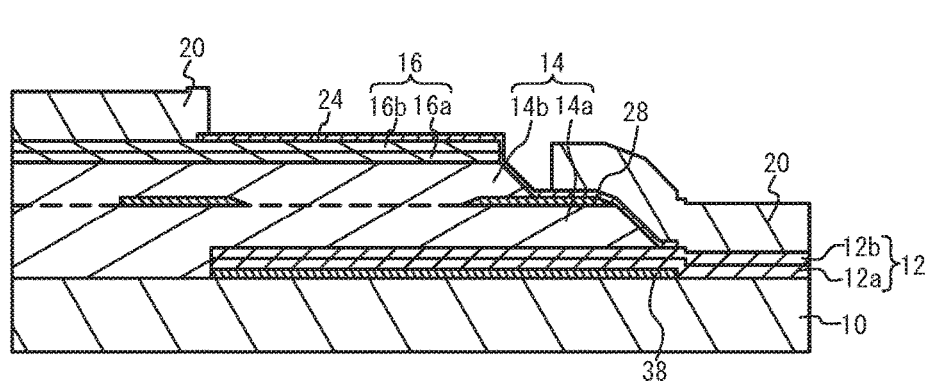

As illustrated in FIG. 5B, the protective film 24 is formed across the entire surface by, for example, sputtering or CVD. As illustrated in FIG. 5C, the protective film 24 is patterned into a desired shape by photolithography and etching. As illustrated in FIG. 5D, the wiring line 20 is formed by, for example, plating.

Then, an etching liquid for the sacrifice layer 38 is introduced into the sacrifice layer 38 under the lower electrode 12 through the hole portion 35 and the introduction path 33 (see FIG. 1A). This process removes the sacrifice layer 38. As a substance for etching the sacrifice layer 38, preferable is a substance that does not etch materials constituting the resonator except the sacrifice layer 38. Especially, a substance for etching is a substance that does not etch the lower electrode 12 with which the substance for etching comes in contact. The stress of the multilayered film including the lower electrode 12 through the protective film 24 is configured to be a compression stress. This configuration causes the multilayered film to bulge toward the opposite side from the substrate 10 so as to separate from the substrate 10 when the sacrifice layer 38 is removed. The air gap 30 having a dome-shaped bulge is formed between the lower electrode 12 and the substrate 10. The above-described processes complete the piezoelectric thin film resonators illustrated in FIG. 1A through FIG. 2B.

To describe the effect of the first embodiment and the variations thereof, the results of a simulation using a two-dimensional finite element method will be described. Materials and film thicknesses used for the simulation are as follows.

Lower layer 12a of the lower electrode 12: Cr film with a film thickness of 100 nm
Upper layer 12b of the lower electrode 12: Ru film with a film thickness of 200 nm
Piezoelectric film 14: AlN film with a film thickness of 1260 nm
Lower piezoelectric film 14a: AlN film with a film thickness of 630 nm
Upper piezoelectric film 14b: AlN film with a film thickness of 630 nm
Insertion film 28: Silicon oxide film with a film thickness of 150 nm
Lower layer 16a of the upper electrode 16: Ru film with a film thickness of 230 nm
Upper layer 16b of the upper electrode 16: Cr film with a film thickness of 35 nm
Width W0 of the resonance region 50: 84 μm
Insertion width W2 of the insertion film 28: 2.8 μm
Distance W4 between the air gap 30 and the resonance region 50: 13 μm
Distance W6: 2 μm
Distance W8: 8 μm The simulation was conducted on samples a through d, D, E, and e as samples of a comparative example and samples A through C as samples of the embodiment. The samples A through E are examples in which the insertion film 28 is located in the piezoelectric film 14, and the samples a through e are examples in which the insertion film 28 is not provided. The samples E and e are examples in which the end face of the piezoelectric film 14 overlaps with the air gap 30 in plan view. The sample A through D and a through d are examples in which at least a part of the end face of the piezoelectric film 14 overlaps with the air gap 30 in plan view.

Figure 6A:
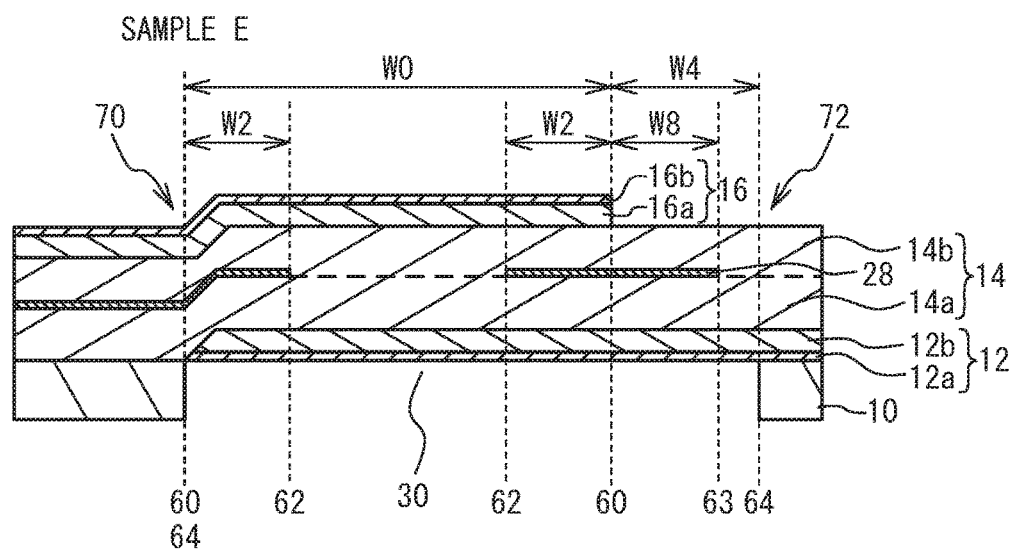
FIG. 6A and FIG. 6B are cross-sectional views of samples E and e of a comparative example, respectively.
Figure 6B:
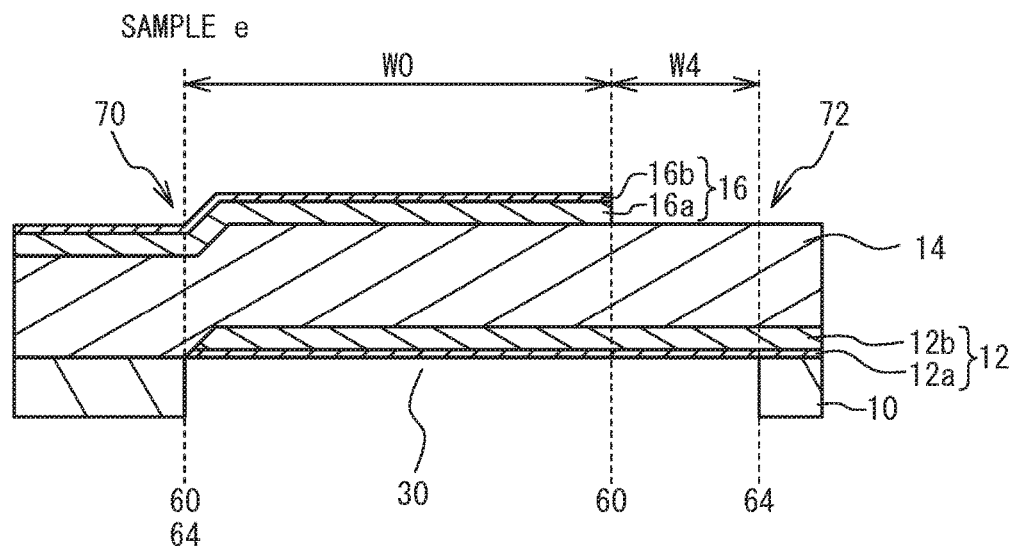

FIG. 6A and FIG. 6B are cross-sectional views of the samples E and e of the comparative example, respectively. As illustrated in FIG. 6A, in the extraction region 70 of the upper electrode 16, the outer outline 60 of the resonance region 50 coincides with the outer outline 64 of the air gap 30. In the region 72 other than the extraction region 70, the outer outline 64 of the air gap 30 is located further out than the outer outline 60 of the resonance region 50. In the sample E, both the outer outlines of the lower piezoelectric film 14a and the upper piezoelectric film 14b are located further out than the outer outline 64 of the air gap 30. The outer outline 63 of the insertion film 28 is located further in than the outer outline 64 of the air gap 30, and is located further out than the outer outline 60 of the resonance region 50. The distance between the outer outline 60 of the resonance region 50 and the outer outline 63 of the insertion film 28 is the distance W8. As illustrated in FIG. 6B, in the sample e, the insertion film 28 is not provided. Other structures are the same as those of the sample E, and the description thereof is thus omitted.

Figure 7A:
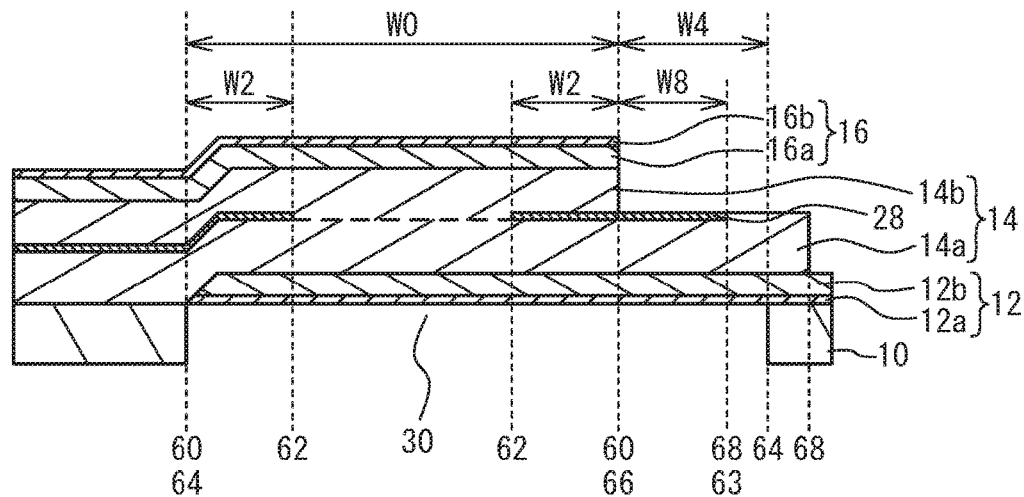
FIG. 7A and FIG. 7B are cross-sectional views of samples A and B of the embodiment, respectively.
Figure 7B:
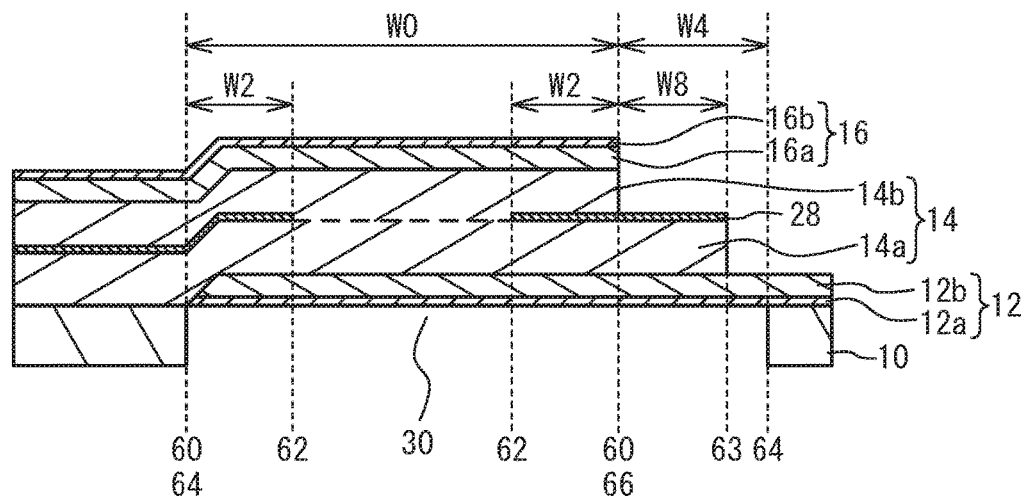

FIG. 7A and FIG. 7B are cross-sectional views of the samples A and B of the embodiment, respectively. As illustrated in FIG. 7A, in the sample A, the outer outline 66 of the upper piezoelectric film 14b coincides with the outer outline 60 of the resonance region 50. Other structures are the same as those of the sample E, and the description thereof is thus omitted. As illustrated in FIG. 7B, in the sample B, the outer outline 68 of the lower piezoelectric film 14a coincides with the outer outline 63 of the insertion film 28. Other structures are the same as those of the sample A, and the description thereof is thus omitted.

Figure 8A:
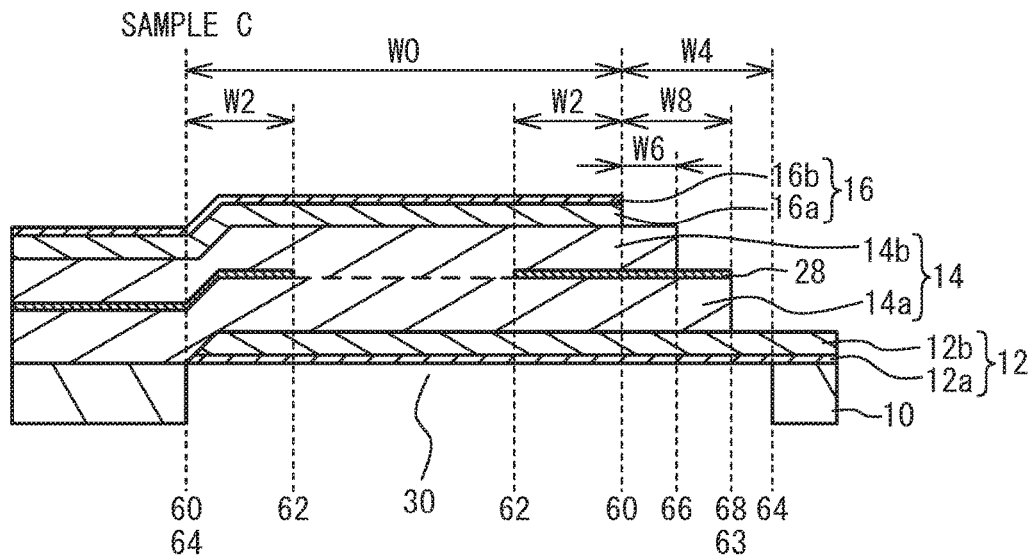
FIG. 8A and FIG. 8B are cross-sectional views of a sample C of the embodiment and a sample D of the comparative example, respectively.
Figure 8B:
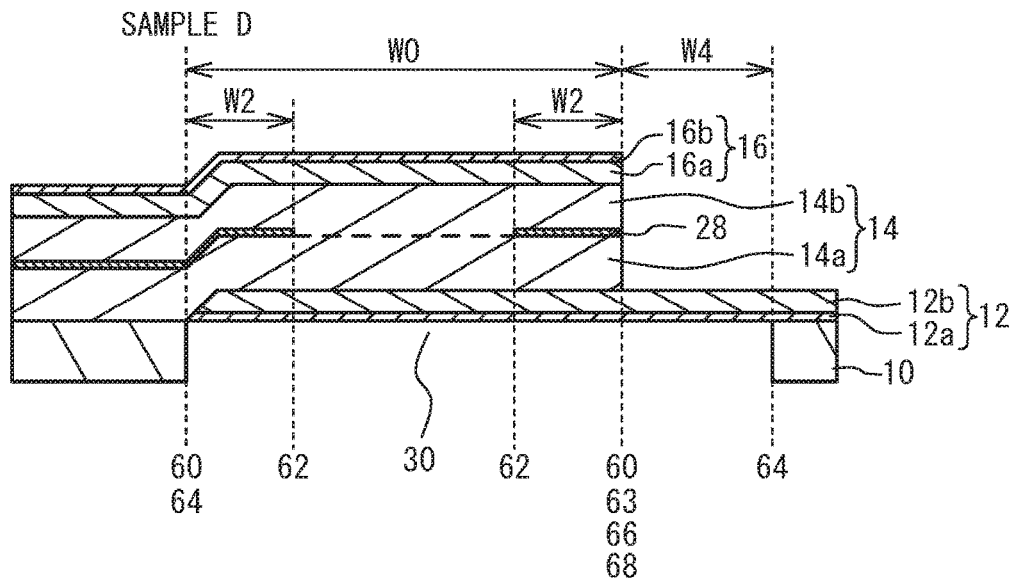

FIG. 8A and FIG. 8B are cross-sectional views of the sample C of the embodiment and the sample D of the comparative example, respectively. As illustrated in FIG. 8A, in the sample C, the outer outline 66 of the upper piezoelectric film 14b is located further out than the outer outline 60 of the resonance region 50, and is located further in than the outer outline 68 of the lower piezoelectric film 14a. The distance between the outer outline 60 of the resonance region 50 and the outer outline 66 of the upper piezoelectric film 14b is the distance W6. Other structures are the same as those of the sample B, and the description thereof is thus omitted. As illustrated in FIG. 8B, in the sample D, the outer outline 68 of the lower piezoelectric film 14a, the outer outline 63 of the insertion film 28, and the outer outline 66 of the upper piezoelectric film 14b coincide with the outer outline 60 of the resonance region 50. Other structures are the same as those of the sample A, and the description thereof is thus omitted.

Figure 9A:
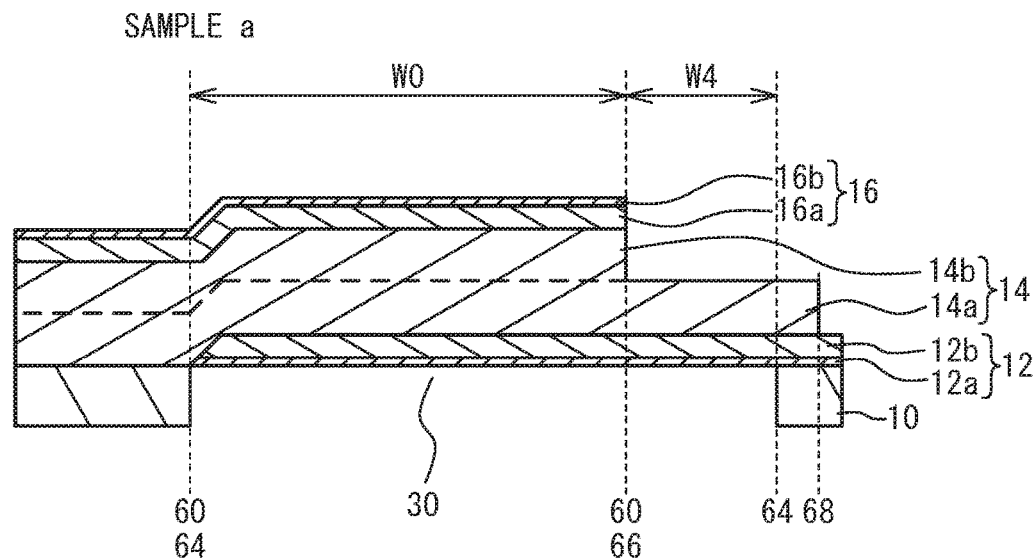
FIG. 9A and FIG. 9B are cross-sectional views of samples a and b of the comparative example, respectively.
Figure 9B:
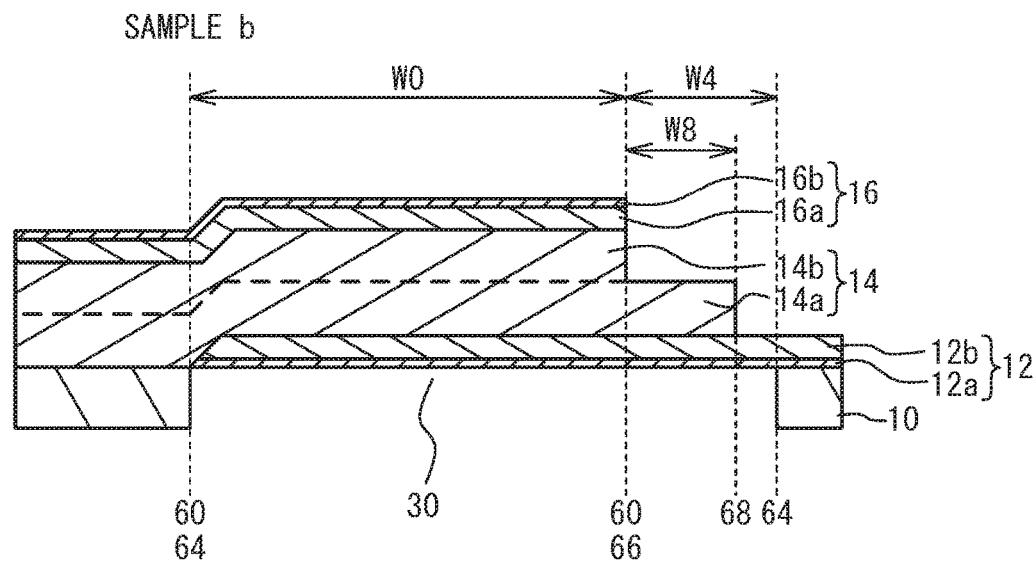

FIG. 9A and FIG. 9B are cross-sectional views of the samples a and b of the comparative example, respectively. As illustrated in FIG. 9A and FIG. 9B, in the samples a and b, the insertion film 28 is not provided. Other structures are the same as those of the samples A and B, respectively, and the description thereof is thus omitted.

Figure 10A:
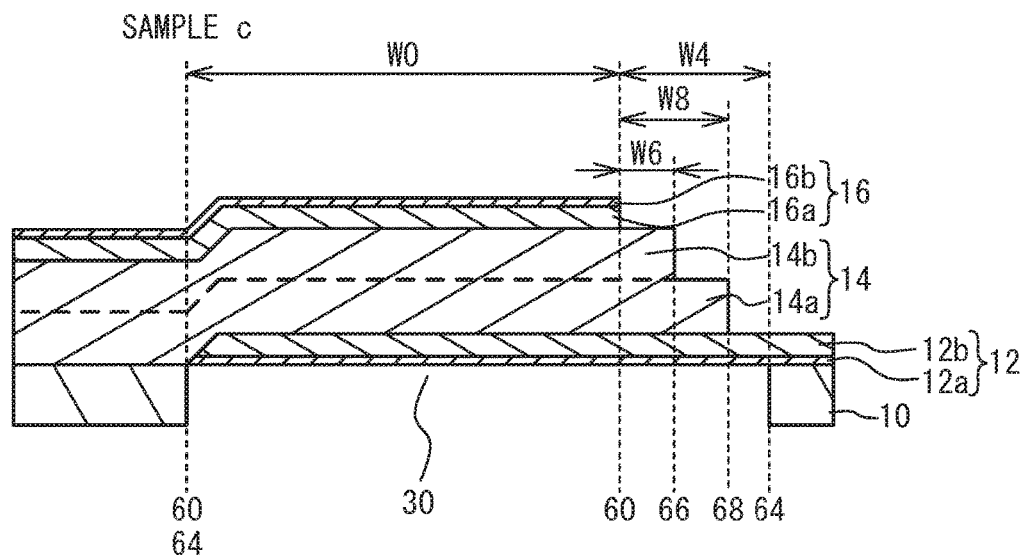
FIG. 10A and FIG. 10B are cross-sectional views of samples c and d of the comparative example, respectively.
Figure 10B:
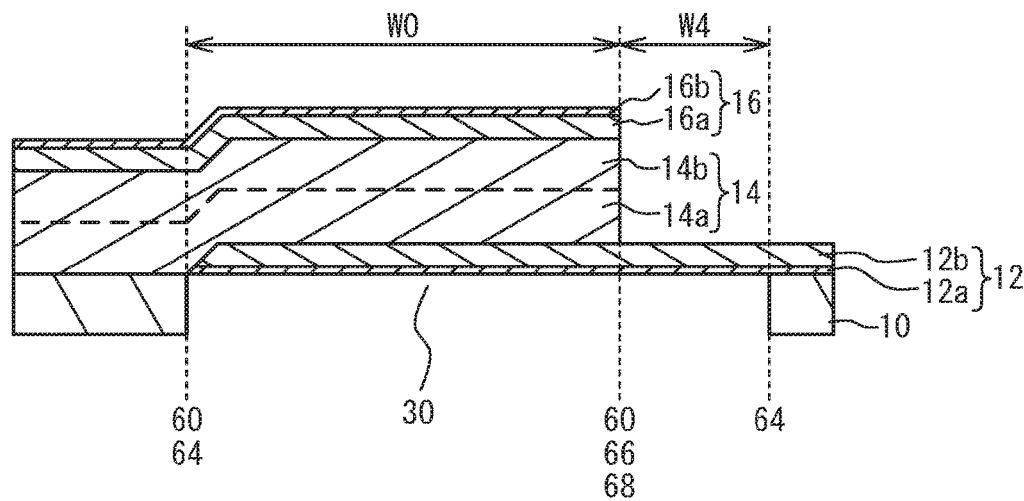

FIG. 10A and FIG. 10B are cross-sectional views of the samples c and d of the comparative example, respectively. As illustrated in FIG. 10A and FIG. 10B, in the samples c and d, the insertion film 28 is not provided. Other structures are the same as those of the samples C and D, respectively, and the description thereof is thus omitted.

Figure 11:
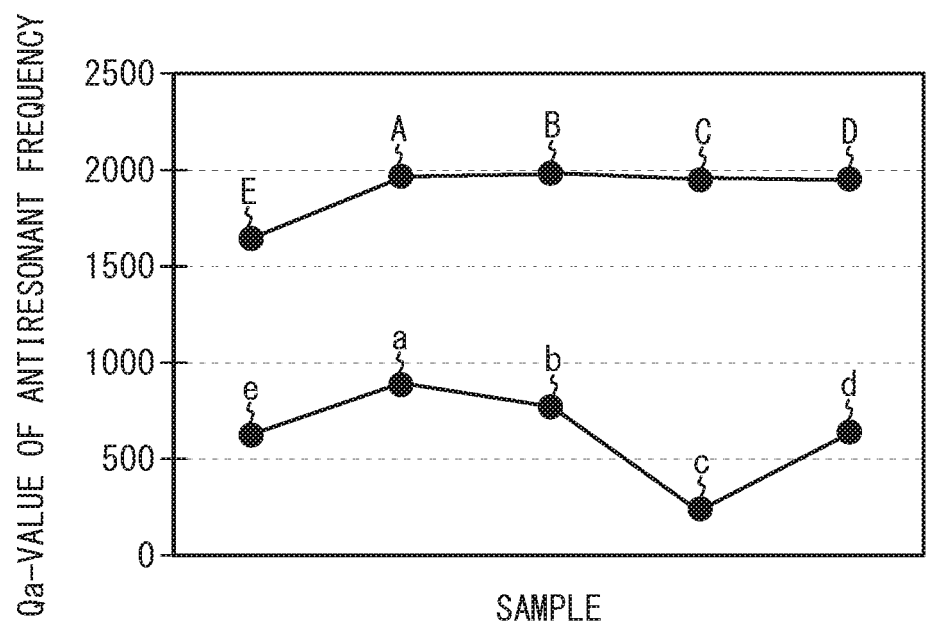
FIG. 11 illustrates the Q-values Qa of the antiresonant frequencies in the samples A through E and a through e.

FIG. 11 illustrates the Q-values Qa of the antiresonant frequencies of the samples A through E and a through e. As illustrated in FIG. 11, Qa of the samples A through E, in which the insertion film 28 is provided, is greater than Qa of the samples a through e in which the insertion film 28 is not provided. In the samples without the insertion film 28, Qa of the sample a is greater than Qa of the sample e. Qa of the samples b and d is approximately equal to Qa of the sample e. Qa of the sample c is a little less than Qa of the sample e. In contrast, in the samples in which the insertion film 28 is provided, Qa of the samples A through D is improved compared to Qa of the sample E. Qa is approximately the same among the samples A through D.

Considering the samples in which the insertion film 28 is provided, the comparison between the sample E and the sample e reveals that the provision of the insertion film 28 causes the acoustic wave propagating from the resonance region 50 in the lateral direction is reflected by the insertion film 28 (between the inner outline 62 of the insertion film 28 and the outer outline 60 of the resonance region 50). Accordingly, the leak of the acoustic wave energy is reduced. However, when the end face of the piezoelectric film 14 is located further out than the outer outline 64 of the air gap 30 as in the sample E, the acoustic wave that has not been reflected by the insertion film 28 leaks to the substrate 10 through the piezoelectric film 14. Thus, in the region 72, the end face of the upper piezoelectric film 14b of the piezoelectric film 14 is structured to be located between the outer outline 60 of the resonance region 50 and the outer outline 64 of the air gap 30 as in the samples A through D. This structure causes the acoustic wave that has not been reflected by the insertion film 28 to be reflected by the end face of the piezoelectric film 14 located between the outer outline 60 of the resonance region 50 and the outer outline 64 of the air gap 30. As described above, the acoustic wave propagating in the lateral direction is reflected by at least two points including the insertion film 28. Therefore, reduced is the deterioration of the resonance characteristics such as a Q-value due to the leak of the acoustic wave propagating in the lateral direction to the substrate 10.

On the other hand, when the insertion film 28 is not provided as in the samples a through d, the Q-value varies depending on the location of the end face of the piezoelectric film 14. The reason is unknown, but it may be considered to be because when the acoustic wave propagating in the lateral direction is not reflected by the insertion film 28, the reflection of the acoustic wave changes depending on the location of the end face of the piezoelectric film 14. As described above, when the insertion film 28 is not provided, the degree of improvement of the Q-value is limited even when at least a part of the end face of the piezoelectric film 14 is structured to be located between the outer outline 60 of the resonance region 50 and the outer outline 64 of the air gap 30. Furthermore, as described in FIG. 5A, the location of the end face of the piezoelectric film 14 easily varies depending on the manufacturing conditions such as an etching time of the piezoelectric film 14. In the samples a through d, when the location of the end face of the piezoelectric film 14 varies in the fabrication process, the Q-value varies. In the samples A through D, as illustrated in FIG. 11, even when the location of the end face of the piezoelectric film 14 varies, the variability of the Q-value can be reduced.

In the structure in which the end face of the piezoelectric film 14 coincides with the end face of the insertion film 28 as in the sample D, the stress of the multilayered film easily concentrates on the lower electrode 12. Especially, since only the lower electrode 12 supports the multilayered film between the outer outline 68 of the lower piezoelectric film 14a and the outer outline 64 of the air gap 30, the lower electrode 12 is easily damaged by impact shock. On the other hand, in the samples A through C, since the outer outline 68 of the lower piezoelectric film 14a is located further out than the outer outline 60 of the resonance region 50, the stress of the multilayered film do not easily concentrate. In addition, the distance between the outer outline 68 of the lower piezoelectric film 14a and the outer outline 64 of the air gap 30 is reduced, and the strength is thus enhanced. Especially when the lower piezoelectric film 14a is located further out than the outer outline 64 of the air gap 30 as in the sample A, the strength can be enhanced.

On the other hand, when the outer outline 68 of the lower piezoelectric film 14a is structured to be located further out than the outer outline 64 of the air gap 30 as in the sample A, the piezoelectric film 14 may be peeled by stress. Thus, it may be considered that the outer outline 68 of the lower piezoelectric film 14a is structured to be located further in than the outer outline 64 of the air gap 30. However, when the insertion film 28 is not provided, as in the samples b through d, the Q-value deteriorates compared to that of the sample a. On the other hand, when the insertion film 28 is provided, as in the samples B through D, the Q-value can be made to be approximately the same as the Q-value of the sample A.

To secure the margin for the variability by the fabrication process, it may be considered that the end face of the upper piezoelectric film 14b is structured to be located further out than the outer outline 60 of the resonance region 50 in the region 72. However, when no insertion film 28 is provided, as in the sample c, the Q-value deteriorates more than that of the sample a. On the other hand, when the insertion film 28 is provided, as in the sample C, the Q-value can be made to be approximately the same as that of the sample A.

Figure 12A:
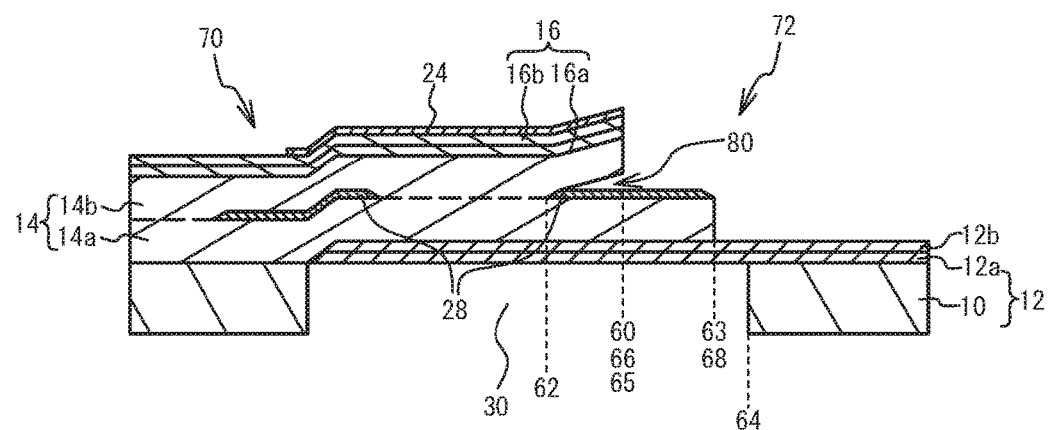
FIG. 12A and FIG. 12B are cross-sectional views for describing the effect of the first embodiment and the variation thereof.
Figure 12B:
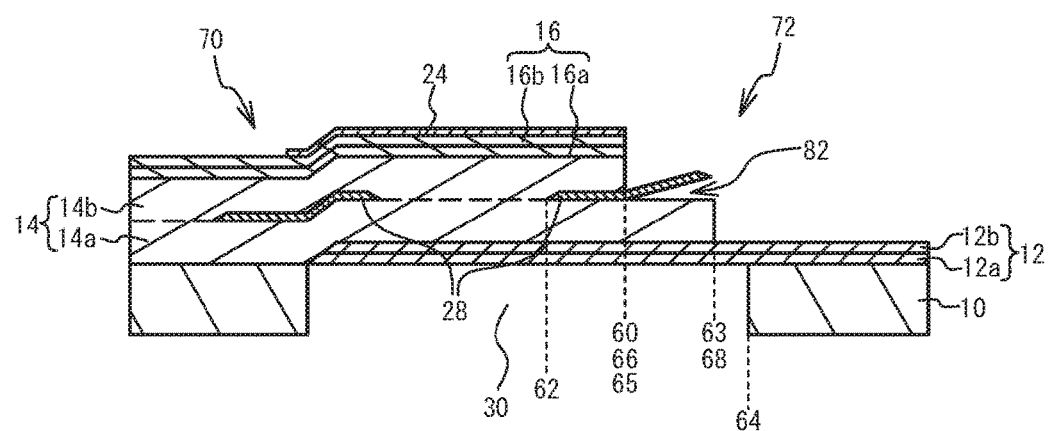

FIG. 12A and FIG. 12B are cross-sectional views for describing the effect of the first embodiment and the variations thereof. As illustrated in FIG. 12A and FIG. 12B, the protective film 24 is not located on the end face of the upper piezoelectric film 14b or the upper surface of the insertion film 28. Since the piezoelectric film 14 and the insertion film 28 are formed of different materials, the adhesiveness of the boundary face therebetween is low. For example, when the piezoelectric film 14 is an aluminum nitride film and the insertion film 28 is a silicon oxide film, the boundary face therebetween has low adhesiveness. Thus, as illustrated in FIG. 12A, peeling 80 occurs at the boundary face between the upper piezoelectric film 14b and the insertion film 28. As illustrated in FIG. 12B, peeling 82 occurs at the boundary face between the lower piezoelectric film 14a and the insertion film 28. The peeling 80 and 82 occurs in, for example, a step for forming the wiring line 20 as illustrated in FIG. 5D. In other than the step of forming a wiring line, the peeling 80 and 82 may be formed in a step after the step of forming the wiring line 20 or because of various factors after the piezoelectric thin film resonator is completed.

In the first embodiment, as illustrated in FIG. 2A and FIG. 2B, the outer outline 66 of the upper piezoelectric film 14b substantially coincides with or is located further out than the outer outline 60 of the resonance region 50 in at least a part of a region surrounding the resonance region (e.g., the region 72). This structure can reduce the variability of the Q-value even when the location of the end face of the piezoelectric film 14 varies as in the samples A through C illustrated in FIG. 11. In the region 72, the outer outline 66 of the upper piezoelectric film 14b is located further in than the outer outline 68 of the lower piezoelectric film 14a. This structure inhibits the stress of the multilayered film from concentrating. In addition, the strength is enhanced.

To form the piezoelectric film 14 so that the outer outline 68 of the lower piezoelectric film 14a is located further out than the outer outline 66 of the upper piezoelectric film 14b, the etching of the lower piezoelectric film 14a using the insertion film 28 as a mask as illustrated in FIG. 5A is simple. In addition, when the lower piezoelectric film 14a is etched using a mask other than the insertion film 28, the insertion film 28 is used as an etching stopper. Then, in the region 72, the insertion film 28 will remain on at least a part of the upper surface of the lower piezoelectric film 14a.

In the above described structures of the samples A through C, as illustrated in FIG. 2A through FIG. 3B, the protective film 24 located on the upper electrode 16 in the resonance region 50 is provided so as to cover the end face 15b of the upper piezoelectric film 14b and at least a part of the upper surface of the insertion film 28 in the region 72. This structure can inhibit the peeling 80 illustrated in FIG. 12A. In addition, the provision of the protective film 24 on the upper electrode 16 in the resonance region 50 allows the protective film 24 to be used as a film that adjusts frequency such as resonant frequency.

In addition, in the region 72, the protective film 24 is located so as to make contact with the end face 15b of the upper piezoelectric film 14b and at least a part of the upper surface of the insertion film 28. This structure can further inhibit the peeling 80.

Furthermore, the protective film 24 and the insertion film 28 are made of the same material (e.g., silicon oxide). This structure improves the adhesiveness between the protective film 24 and the insertion film 28, further inhibiting the peeling 80.

Furthermore, as illustrated in FIG. 3A and FIG. 3B, at least one of the end face 15b of the upper piezoelectric film 14b and the end face 15a of the lower piezoelectric film 14a is inclined so that the lower edge is located further out than the upper edge. This structure can further reduce the stress concentration on the piezoelectric film 14.

Furthermore, as illustrated in FIG. 2A through FIG. 3B, the wiring line 20 covers the outer outline 63 of the insertion film 28. This structure can inhibit the peeling 82 of the insertion film 28 illustrated in FIG. 12B. The protective film 24 preferably covers the boundary face between the insertion film 28 and the lower piezoelectric film 14a. That is, the outer outline 65 of the protective film 24 is preferably located further out than the outer outline of the insertion film 28. This structure can inhibit the peeling 82 illustrated in FIG. 12B in a step of forming the wiring line 20.

When the piezoelectric film 14 is exposed to an etching liquid for removing the sacrifice layer 38, the piezoelectric film 14 deteriorates. For example, when hydrofluoric acid, nitric acid, or buffered hydrofluoric acid is used as an etching liquid for removing the sacrifice layer 38, the piezoelectric film 14 made of aluminum nitride is etched. The piezoelectric film 14 may deteriorate because of other steps. As illustrated in FIG. 2A through FIG. 3B, the protective film 24 covers the end face of the piezoelectric film 14. This structure can inhibit the piezoelectric film 14 from deteriorating.

Figure 13A:
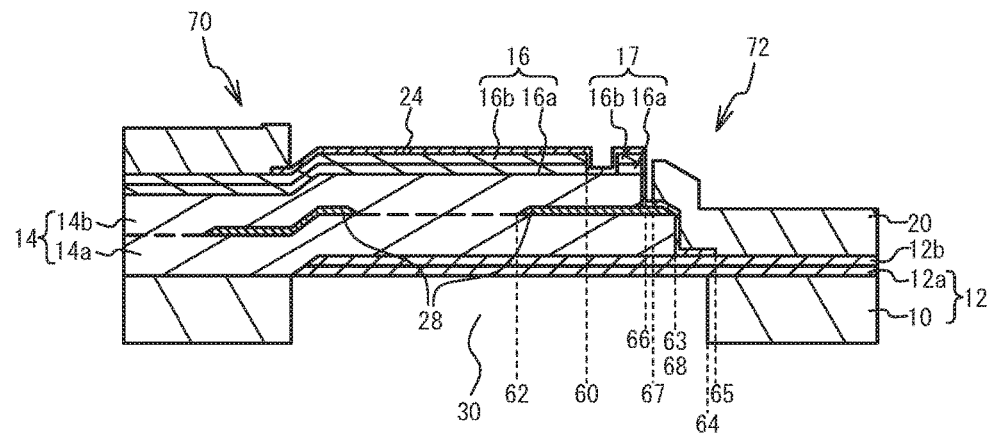
FIG. 13A through FIG. 13C are cross-sectional views of a piezoelectric thin film resonator in accordance with a third variation of the first embodiment.
Figure 13B:
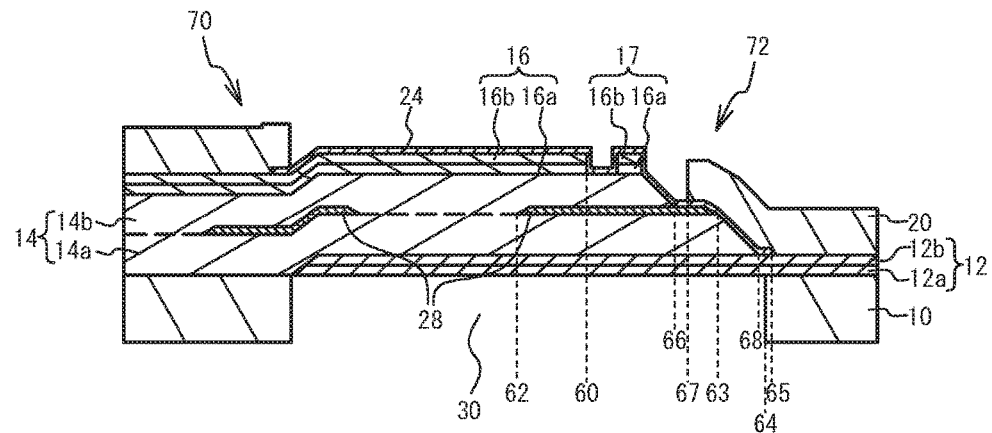
Figure 13C:
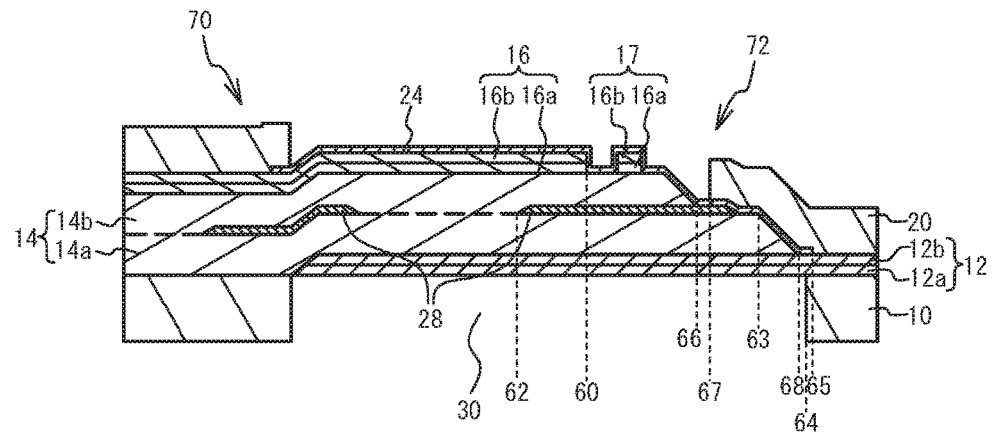

FIG. 13A through FIG. 13C are cross-sectional views of a piezoelectric thin film resonator in accordance with a third variation of the first embodiment. As illustrated in FIG. 13A through FIG. 13C, the third variation of the first embodiment differs from the first embodiment and the first and second variations thereof in that an additional film 17 is located on the upper piezoelectric film 14b located outside the outer outline 66 of the upper piezoelectric film 14b in the region 72. The additional film 17 is formed of the lower layer 16a and the upper layer 16b forming the upper electrode 16. Other structures are the same as those of FIG. 2B and FIG. 3A, and the description thereof is thus omitted.

The additional film 17 functions as an etching stopper when the piezoelectric film 14 is etched. For example, in the sample C, the alignment precision between the outer outline 66 of the upper piezoelectric film 14b and the outer outline 60 of the resonance region 50 is affected by alignment precision of a mask in photolithography. In contrast, in the third variation of the first embodiment, the upper piezoelectric film 14b can be etched using the additional film 17 as a mask. Thus, the outer outline 66 of the upper piezoelectric film 14b can be precisely formed. In addition, the additional film 17 shares at least a layer of the upper electrode 16. This structure can simplify the fabrication process.

Second Embodiment

Figure 14A:
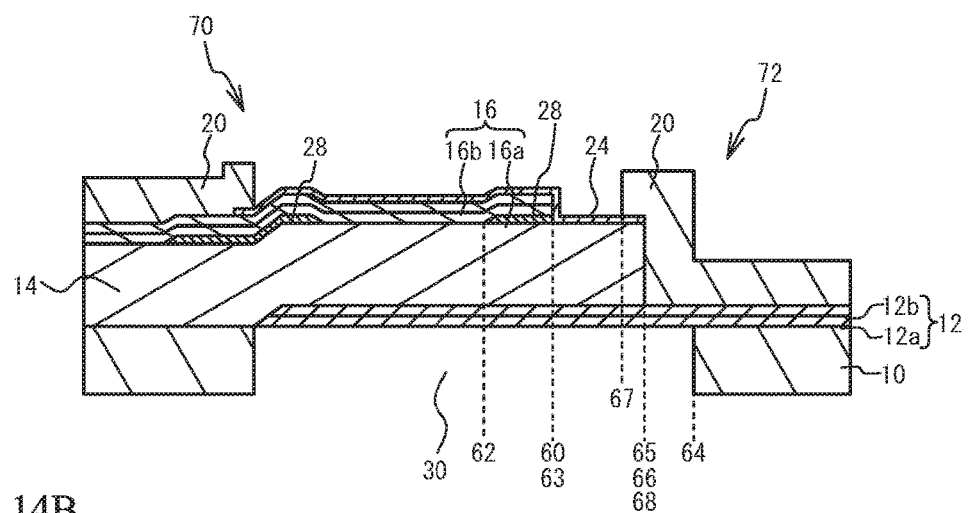
FIG. 14A and FIG. 14B are cross-sectional views of a second embodiment and a first variation thereof, respectively.
Figure 14B:
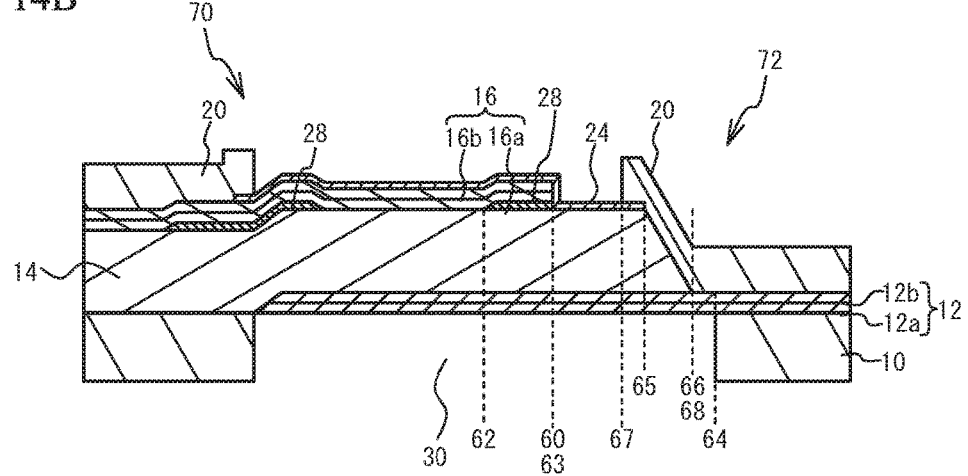

FIG. 14A and FIG. 14B are cross-sectional views of a second embodiment and a first variation thereof, respectively. In FIG. 14A through FIG. 15B, the outer outline of the piezoelectric film 14 is illustrated as outer outlines 66 and 68. As illustrated in FIG. 14A and FIG. 14B, the insertion film 28 is interposed between the piezoelectric film 14 and the upper electrode 16. In the region 72, the outer outline 63 of the insertion film 28 substantially coincides with the outer outline 60 of the resonance region 50. When the upper electrode 16 is patterned by etching, if the etching selectivity between the upper electrode 16 and the insertion film 28 is low, the insertion film 28 outside the upper electrode 16 is etched. The protective film 24 covers the end face of the upper electrode 16, the end face of the insertion film 28, and the upper surface of the piezoelectric film 14. The wiring line 20 covers a part of the protective film 24. In FIG. 14A, the end face of the piezoelectric film 14 is substantially perpendicular to the upper surface of the substrate 10. In FIG. 14B, the end face of the piezoelectric film 14 is inclined to the substrate 10. Other structures are the same as those of the first embodiment and the variations thereof, and the description thereof is thus omitted.

Figure 15A:
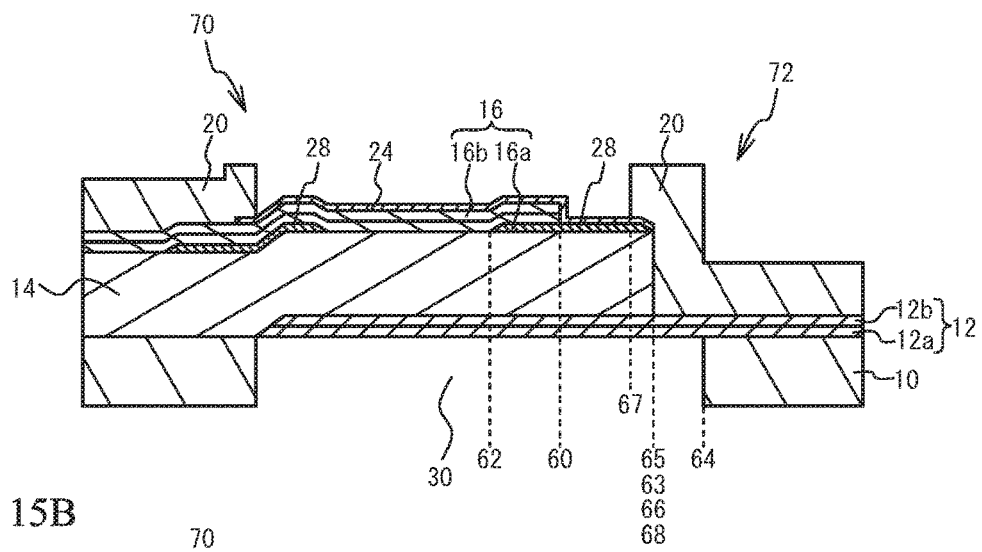
FIG. 15A and FIG. 15B are cross-sectional views of second and third variations of the second embodiment, respectively.
Figure 15B:
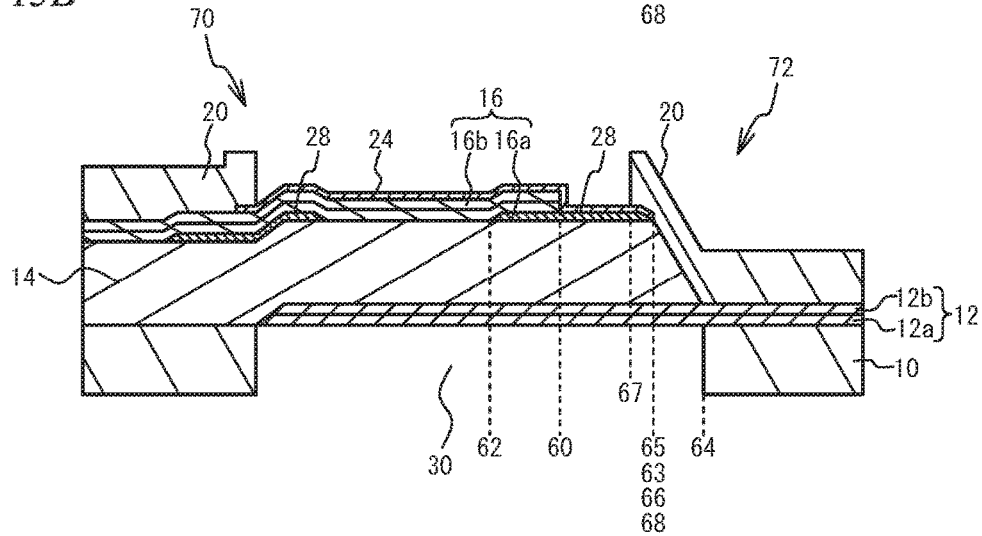

FIG. 15A and FIG. 15B are cross-sectional views of second and third variations of the second embodiment. As illustrated in FIG. 15A and FIG. 15B, in the region 72, the outer outline 63 of the insertion film 28 substantially coincides with the outer outline of the upper surface of the piezoelectric film 14. When the upper electrode 16 is patterned by etching, if the etching selectivity between the upper electrode 16 and the insertion film 28 is high, and the piezoelectric film 14 is etched using the insertion film 28 as a mask, the following structure is obtained. The protective film 24 covers the upper surface of the insertion film 28. The wiring line 20 covers a part of the protective film 24. In FIG. 15A, the end face of the piezoelectric film 14 is substantially perpendicular to the upper surface of the substrate 10. In FIG. 15B, the end face of the piezoelectric film 14 is inclined to the substrate 10. Other structures are the same as those of FIG. 14A and FIG. 14B, and the description thereof is thus omitted.

Figure 16A:
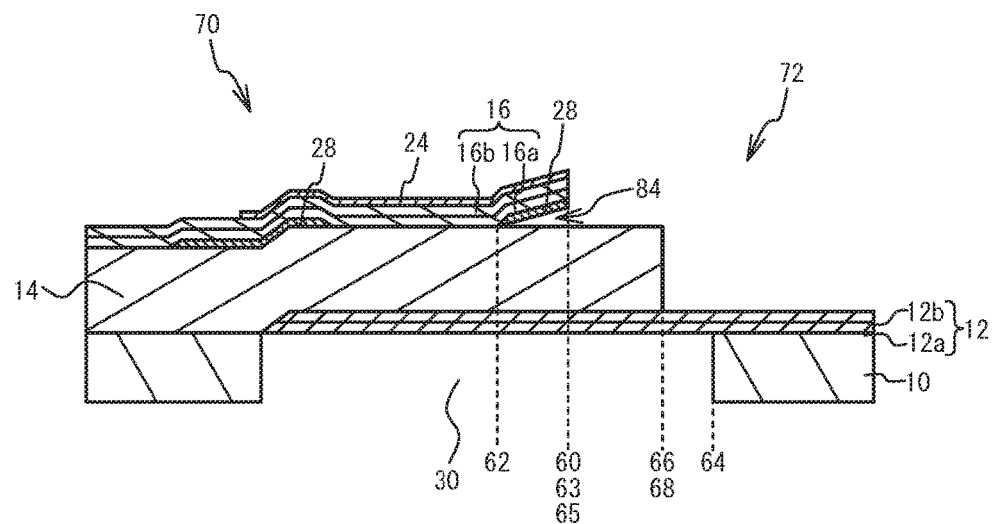
FIG. 16A and FIG. 16B are cross-sectional views for describing the effect of the second embodiment and the variations thereof.
Figure 16B:
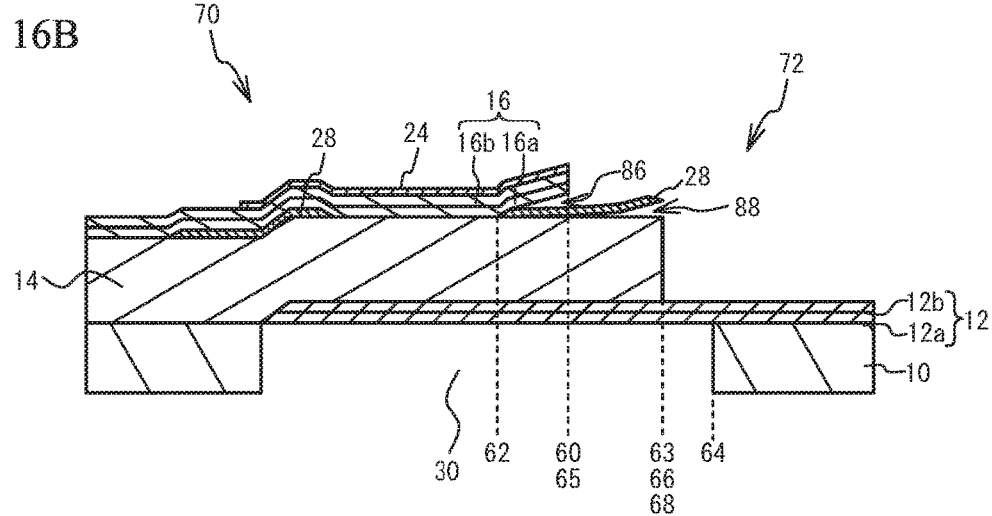

FIG. 16A and FIG. 16B are cross-sectional views for describing the effects of the second embodiment and the variations thereof. As illustrated in FIG. 16A and FIG. 16B, the protective film 24 is not located on the end face of the upper electrode 16 or the upper surface of the insertion film 28. In FIG. 16A, as in FIG. 14A and FIG. 14B, the insertion film 28 substantially coincides with the end face of the upper electrode 16. In FIG. 16B, as in FIG. 15A and FIG. 15B, the insertion film 28 extends to the upper surface of the piezoelectric film 14.

The adhesiveness between the insertion film 28 and the piezoelectric film 14 is low. Thus, as illustrated in FIG. 16A, peeling 84 occurs at the boundary face between the piezoelectric film 14 and the insertion film 28. As illustrated in FIG. 16B, peeling 86 occurs at the boundary face between the upper electrode 16 and the insertion film 28. Peeling 88 occurs at the boundary face between the piezoelectric film 14 and the insertion film 28. The peeling 84 through 88 may occur in a step of forming the wiring line 20, in a step after the step of forming the wiring line 20, or because of various factors after the piezoelectric thin film resonator is completed.

In the second embodiment and the variations thereof, the insertion film 28 is interposed between the piezoelectric film 14 and the upper electrode 16. In the region 72, the outer outlines 66 and 68 of the piezoelectric film 14 are located further out than the outer outline 60 of the resonance region 50. In the above-described structure, the outer outline 65 of the protective film 24 is structured to be located further out than the outer outline 60 of the resonance region 50. This structure can inhibit the peeling 84 and 86 illustrated in FIG. 16A and FIG. 16B.

As illustrated in FIG. 14A and FIG. 14B, in the region 72, the outer outline 63 of the insertion film 28 substantially coincides with or is located further in than the outer outline 60 of the resonance region 50. In the above-described structure, in the region 72, the protective film 24 covers the end face of the upper electrode 16 and at least a part of the upper surface of the piezoelectric film 14. This structure makes the protective film 24 cover the upper and lower surfaces of the insertion film 28, thereby inhibiting the peeling 84 and 86. The protective film 24 preferably makes contact with the end face of the upper electrode 16 and at least a part of the upper surface of the piezoelectric film 14.

When the adhesiveness between the protective film 24 and the piezoelectric film 14 is low (for example, when the protective film 24 and the insertion film 28 are made of the same material), the wiring line 20 covers an outer outline 25 of the protective film 24. This structure can inhibit the protective film 24 from being peeled from the piezoelectric film 14.

As illustrated in FIG. 15A and FIG. 15B, in the region 72, the insertion film 28 is located on at least a part of the upper surface of the piezoelectric film 14. In the above-described structure, in the region 72, the outer outline 65 of the protective film 24 is located further out than the inner outline 67 of the wiring line 20. This structure makes the wiring line 20 cover the lower surface of the insertion film 28, thereby inhibiting the peeling 88. When the outer outline 65 of the protective film 24 is located further out than the inner outline 67 of the wiring line 20, the protective film 24 may be located between the insertion film 28 and the wiring line 20. The protective film 24 may be located on the wiring line 20.

In the second embodiment and the variations thereof, the protective film 24 may cover the end face of the piezoelectric film 14. This structure can reduce the deterioration of the piezoelectric film 14.

Third Embodiment

Figure 17A:
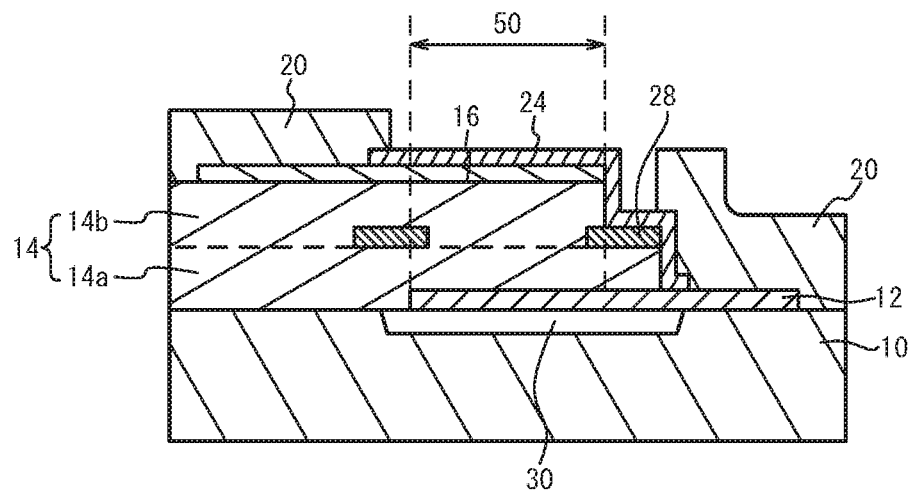
FIG. 17A is a cross-sectional view of a piezoelectric thin film resonator in accordance with a third embodiment.
Figure 17B:
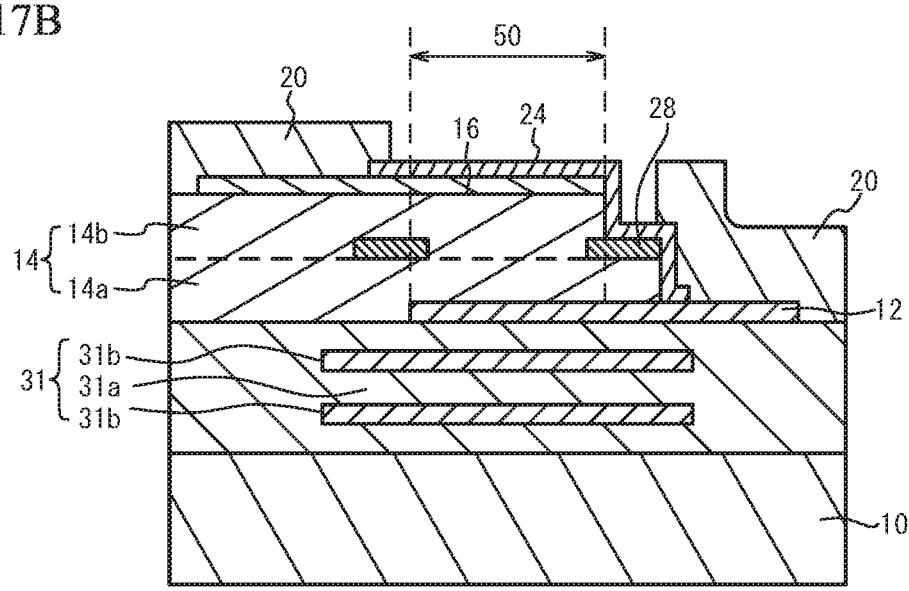
FIG. 17B is a cross-sectional view of a piezoelectric thin film resonator in accordance with a first variation of the third embodiment.

A third embodiment and a first variation thereof change the structure of the air gap. FIG. 17A is a cross-sectional view of a piezoelectric thin film resonator of the third embodiment, and FIG. 17B is a cross-sectional view of a piezoelectric thin film resonator of the first variation of the third embodiment. As illustrated in FIG. 17A, a recess is formed on the upper surface of the substrate 10. The lower electrode 12 is flatly formed on the substrate 10. This structure allows the air gap 30 to be formed in the recess of the substrate 10. The air gap 30 is formed so as to include the resonance region 50. Other structures are the same as those of the first embodiment, and the description thereof is thus omitted. The air gap 30 may be formed so as to penetrate through the substrate 10. An insulating film making contact with the lower surface of the lower electrode 12 may be formed. That is, the air gap 30 may be formed between the substrate 10 and the insulating film making contact with the lower electrode 12. The insulating film may be, for example, an aluminum nitride film.

As illustrated in FIG. 17B, an acoustic mirror 31 is formed under the lower electrode 12 in the resonance region 50. The acoustic mirror 31 is formed of a film 31a with low acoustic impedance and a film 31b with high acoustic impedance alternately arranged. Each of the films 31a and 31b has a film thickness of, for example, λ/4 (λ is the wavelength of the acoustic wave). The stacking number of the film 31a and the film 31b may be freely designed. The acoustic mirror 31 may be formed by stacking at least two kinds of layers with different acoustic characteristics at intervals. The substrate 10 may be one of the two kinds of layers with different acoustic characteristics of the acoustic mirror 31. For example, the acoustic mirror 31 may be structured by locating a single film with acoustic impedance different from that of the substrate 10 in the substrate 10. Other structures are the same as those of the first embodiment, and the description thereof is thus omitted.

In the second embodiment and the variation thereof, the air gap 30 may be formed as in the third embodiment, or the acoustic mirror 31 may be formed instead of the air gap 30 as in the first variation of the third embodiment.

As in the first and second embodiments, the variations thereof, and the third embodiment, the piezoelectric thin film resonator may be a Film Bulk Acoustic Resonator (FBAR) in which the air gap 30 is formed between the substrate 10 and the lower electrode 12 in the resonance region 50. Alternatively, as in the first variation of the third embodiment, the piezoelectric thin film resonator may be a Solidly Mounted Resonator (SMR) in which the acoustic mirror 31 configured to reflect the acoustic wave propagating through the piezoelectric film 14 is located under the lower electrode 12 in the resonance region 50.

The first through third embodiments and the variations thereof have described an exemplary case where the outer outline 64 of the air gap 30 or the acoustic mirror 31 substantially coincides with the outer outline 60 of the resonance region 50 in the extraction region 70, but the outer outline 64 of the air gap 30 or the acoustic mirror 31 may be located further out than the outer outline 60 of the resonance region 50. In addition, an exemplary case where the piezoelectric film 14 or the upper piezoelectric film 14b is located between the outer outline 60 of the resonance region 50 and the outer outline 64 of the air gap 30 or the acoustic mirror 31 in the region 72 has been described, but it is only required that the piezoelectric film 14 or the upper piezoelectric film 14b is located between the outer outline 60 of the resonance region 50 and the outer outline 64 of the air gap 30 or the acoustic mirror 31 in the region 72. Furthermore, an exemplary case where the resonance region 50 has an elliptical shape has been described, but the resonance region 50 may have other shapes. For example, the resonance region 50 may have a polygonal shape such as a quadrangle shape or a pentagonal shape.

Fourth Embodiment

Figure 18A:
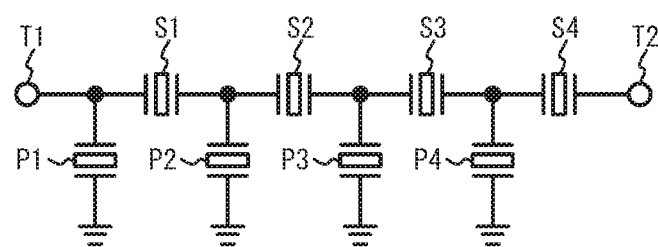
FIG. 18A is a circuit diagram of a filter in accordance with a fourth embodiment.

A fourth embodiment is an exemplary filter and an exemplary duplexer using the piezoelectric thin film resonator according to any one of the first through third embodiments and the variations thereof. FIG. 18A is a circuit diagram of a filter in accordance with the fourth embodiment. As illustrated in FIG. 18A, one or more series resonators S1 through S4 are connected in series between an input terminal T1 and an output terminal T2. One or more parallel resonators P1 through P4 are connected in parallel between the input terminal T1 and the output terminal T2. At least one of the one or more series resonators S1 through S4 and the one or more parallel resonators P1 through P4 may be the acoustic wave resonator according to any one of the first through third embodiments and the variations thereof. The number of resonators in the ladder-type filter can be appropriately designed. The filter including the acoustic wave resonator according to any one of the first through third embodiments and the variations thereof may be a multimode filter in addition to a ladder-type filter.

Figure 18B:
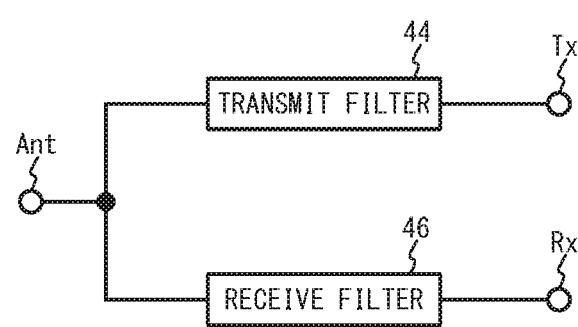
FIG. 18B is a circuit diagram of a duplexer in accordance with a variation of the fourth embodiment.

FIG. 18B is a circuit diagram of a duplexer in accordance with a variation of the fourth embodiment. As illustrated in FIG. 18B, a transmit filter 44 is connected between a common terminal Ant and a transmit terminal Tx. A receive filter 46 is connected between the common terminal Ant and a receive terminal Rx. The transmit filter 44 transmits signals in the transmit band to the common terminal Ant as transmission signals among signals input from the transmit terminal Tx, and suppresses signals with other frequencies.

The receive filter 46 transmits signals in the receive band to the receive terminal Rx as reception signals among signals input from the common terminal Ant, and suppresses signals with other frequencies. At least one of the transmit filter 44 or the receive filter 46 may be the filter of the fourth embodiment.

The filter includes the piezoelectric thin film resonator according to any one of the first through third embodiments and the variations thereof. Accordingly, the insertion film is inhibited from being peeled.

At least one of the transmit filter 44 or the receive filter 46 may be a filter including the piezoelectric thin film resonator according to any one of the first through third embodiments and the variations thereof.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
   a substrate;
   a lower electrode and an upper electrode that are located on the substrate, and face each other in a stacking direction;
   a piezoelectric film that is sandwiched between the lower electrode and the upper electrode, and includes a lower piezoelectric film and an upper piezoelectric film, an outer outline of the upper piezoelectric film coinciding with or being located further out than an outer outline of a resonance region, in which the lower electrode and the upper electrode face each other across the piezoelectric film, in at least a part of a region surrounding the resonance region, the outer outline of the upper piezoelectric film being located further in than an outer outline of the lower piezoelectric film in the at least a part of the region surrounding the resonance region;
   an insertion film that is interposed between the lower piezoelectric film and the upper piezoelectric film, is located in at least a part of an outer peripheral region within the resonance region, is not located in a central region of the resonance region, and is located on at least a part of an upper surface of the lower piezoelectric film in the at least a part of the region surrounding the resonance region;
   a protective film that is located on the upper electrode in the resonance region, and is located so as to cover an end face of the upper piezoelectric film and at least a part of an upper surface of the insertion film in the at least a part of the region surrounding the resonance region; and
   a wiring line connecting to the lower electrode in an extraction region of the lower electrode, wherein the wiring line covers an outer outline of the insertion film in the at least a part of the region surrounding the resonance region.

2. The piezoelectric thin film resonator according to claim 1, wherein an acoustic impedance of the insertion film is less than an acoustic impedance of the piezoelectric film.

3. The piezoelectric thin film resonator according to claim 1, wherein
   the protective film makes contact with the end face of the upper piezoelectric film and the at least a part of the upper surface of the insertion film in the at least a part of the region surrounding the resonance region.

4. The piezoelectric thin film resonator according to claim 3, wherein the protective film and the insertion film are made of a same material.

5. The piezoelectric thin film resonator according to claim 1, wherein at least one of end faces of the upper piezoelectric film and the lower piezoelectric film is inclined.

6. The piezoelectric thin film resonator according to claim 1, further comprising:
an acoustic mirror layer that includes an air gap or an acoustic mirror in which at least two kinds of layers with different acoustic characteristics are stacked, wherein
the outer outline of the lower piezoelectric film is located further in than an outer outline of the acoustic reflection layer in the at least a part of the region surrounding the resonance region.

7. A filter comprising:
the piezoelectric thin film resonator according to claim 1.

8. A duplexer comprising:
the filter according to claim 7.

9. A piezoelectric thin film resonator comprising:
a substrate;
a lower electrode and an upper electrode that are located on the substrate, and face each other in a stacking direction;
a piezoelectric film that is sandwiched between the lower electrode and the upper electrode, and of which an outer outline of an upper surface is located further out than an outer outline of a resonance region, in which the lower electrode and the upper electrode face each other across the piezoelectric film, in at least a part of a region surrounding the resonance region;
an insertion film that is interposed between the piezoelectric film and the upper electrode, is located in at least a part of an outer peripheral region within the resonance region, and is not located in a central region of the resonance region;
a protective film that is located on the upper electrode in the resonance region, and of which an outer outline is located further out than an outer outline of the resonance region in the at least a part of the region surrounding the resonance region; and
a wiring line connecting to the lower electrode in an extraction region of the lower electrode,
wherein:
an outer outline of the insertion film coincides with or is located further in than an outer outline of the upper electrode in the at least a part of the region surrounding the resonance region,
the protective film covers an end face of the upper electrode and at least a part of an upper surface of the piezoelectric film in the at least a part of the region surrounding the resonance region, and
the wiring line covers the outer outline of the protective film in the at least a part of the region surrounding the resonance region.

10. A filter comprising:
the piezoelectric thin film resonator according to claim 9.

11. A duplexer comprising:
the filter according to claim 10.

12. A piezoelectric thin film resonator comprising:
a substrate;
a lower electrode and an upper electrode that are located on the substrate, and face each other in a stacking direction;
a piezoelectric film that is sandwiched between the lower electrode and the upper electrode, and of which an outer outline of an upper surface is located further out than an outer outline of a resonance region, in which the lower electrode and the upper electrode face each other across the piezoelectric film, in at least a part of a region surrounding the resonance region;
an insertion film that is interposed between the piezoelectric film and the upper electrode, is located in at least a part of an outer peripheral region within the resonance region, and is not located in a central region of the resonance region;
a protective film that is located on the upper electrode in the resonance region, and of which an outer outline is located further out than an outer outline of the resonance region in the at least a part of the region surrounding the resonance region; and
a wiring line connecting to the lower electrode in an extraction region of the lower electrode, wherein
an insertion film is located on an upper surface of the piezoelectric film in the at least a part of the region surrounding the resonance region, and
the wiring line covers an outer outline of the insertion film in the at least a part of the region surrounding the resonance region.

13. A filter comprising:
the piezoelectric thin film resonator according to claim 12.

14. A duplexer comprising:
the filter according to claim 13.

* * * * *